(12) United States Patent
Hashimoto et al.

(10) Patent No.: US 10,613,439 B2
(45) Date of Patent: Apr. 7, 2020

(54) PHOTOSENSITIVE COLORED RESIN COMPOSITION

(71) Applicant: TORAY INDUSTRIES, INC., Tokyo (JP)

(72) Inventors: Keika Hashimoto, Otsu (JP); Satoshi Kamemoto, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 307 days.

(21) Appl. No.: 15/712,864

(22) Filed: Sep. 22, 2017

(65) Prior Publication Data

US 2018/0011404 A1    Jan. 11, 2018

Related U.S. Application Data

(63) Continuation of application No. PCT/JP2016/059936, filed on Mar. 28, 2016.

(30) Foreign Application Priority Data

Apr. 1, 2015    (JP) .................................. 2015-074976

(51) Int. Cl.
   *G03F 7/022*    (2006.01)
   *G03F 7/037*    (2006.01)
   (Continued)

(52) U.S. Cl.
   CPC .............. *G03F 7/0387* (2013.01); *C08G 8/12* (2013.01); *C08G 69/26* (2013.01); *C08G 73/106* (2013.01);
   (Continued)

(58) Field of Classification Search
   CPC ........ G03F 7/0007; G03F 7/105; G03F 7/022; G03F 7/0226; G03F 7/027; G03F 7/387;
   (Continued)

(56) References Cited

U.S. PATENT DOCUMENTS

2002/0045111 A1    4/2002   Machiguchi et al.
2002/0045112 A1*   4/2002   Kishimoto ............. G02B 5/223
                                                    430/7
(Continued)

FOREIGN PATENT DOCUMENTS

JP         8-85712 A     4/1996
JP        10-254129 A    9/1998
(Continued)

OTHER PUBLICATIONS

International Search Report, issued in PCT/JP2016/059936, PCT/ISA/210, dated Jun. 28, 2016.
(Continued)

*Primary Examiner* — John A McPherson
(74) *Attorney, Agent, or Firm* — Birch, Stewart, Kolasch & Birch, LLP

(57) ABSTRACT

The invention aims to provide a photosensitive colored resin composition and a heat resistant colored resin film produced therefrom that has the function of absorbing light in the shorter visible wavelength range with high sensitivity to serve effectively as planarizing film, insulation layer, and barrier rib used in organic luminescence apparatuses and display elements and the function of reducing external light reflection. The photosensitive colored resin composition includes an alkali-soluble resin (a), a photosensitive compound (b), and a compound (c) having an absorption maximum in the wavelength range of 400 nm or more and less than 490 nm, the photosensitive compound (b) containing a photosensitive compound (b1), the photosensitive compound (b1) being such that its maximum absorption wavelength in the range of 350 nm or more and 450 nm or less is located within the wavelength range of 350 nm or more and 390 nm or less.

15 Claims, 1 Drawing Sheet

(51) Int. Cl.

| | |
|---|---|
| *G03F 7/038* | (2006.01) |
| *G03F 7/027* | (2006.01) |
| *C08G 73/10* | (2006.01) |
| *C08G 73/14* | (2006.01) |
| *C08G 73/22* | (2006.01) |
| *C09D 179/08* | (2006.01) |
| *G03F 7/00* | (2006.01) |
| *C08G 8/12* | (2006.01) |
| *G03F 7/105* | (2006.01) |
| *C09D 183/06* | (2006.01) |
| *H01L 51/52* | (2006.01) |
| *G03F 7/023* | (2006.01) |
| *C08G 69/26* | (2006.01) |
| *C08G 77/14* | (2006.01) |
| *H01L 27/32* | (2006.01) |
| *G03F 7/075* | (2006.01) |

(52) U.S. Cl.
CPC ..... *C08G 73/1007* (2013.01); *C08G 73/1017* (2013.01); *C08G 73/1039* (2013.01); *C08G 73/1082* (2013.01); *C08G 73/14* (2013.01); *C08G 73/22* (2013.01); *C09D 179/08* (2013.01); *C09D 183/06* (2013.01); *G03F 7/0007* (2013.01); *G03F 7/027* (2013.01); *G03F 7/0226* (2013.01); *G03F 7/0233* (2013.01); *G03F 7/105* (2013.01); *H01L 51/5284* (2013.01); *C08G 77/14* (2013.01); *G03F 7/0757* (2013.01); *H01L 27/3244* (2013.01); *H01L 27/3274* (2013.01)

(58) Field of Classification Search
CPC . G03F 7/031; H01L 51/5284; H01L 27/3244; H01L 27/3274
USPC ..................................... 430/7, 270.1, 281.1
See application file for complete search history.

(56) References Cited

U.S. PATENT DOCUMENTS

| | | | |
|---|---|---|---|
| 2004/0197703 | A1 | 10/2004 | Miyoshi et al. |
| 2009/0267239 | A1* | 10/2009 | Kanada .................. G03F 7/022 257/787 |
| 2014/0343187 | A1 | 11/2014 | Lee et al. |

FOREIGN PATENT DOCUMENTS

| | | |
|---|---|---|
| JP | 2002-14221 A | 1/2002 |
| JP | 2003-315993 A | 11/2003 |
| JP | 2004-326094 A | 11/2004 |
| JP | 2008-39961 A | 2/2008 |
| JP | 2009-31344 A | 2/2009 |
| JP | 2011-180169 A | 9/2011 |
| JP | 2014-123008 A | 7/2014 |
| WO | WO 2006/101211 A1 | 9/2006 |
| WO | WO 2012/121179 A1 | 9/2012 |
| WO | WO 2015/046332 A1 | 4/2015 |

OTHER PUBLICATIONS

Written Opinion of the International Searching Authority, issued in PCT/JP2016/059936, PCT/ISA/237, dated Jun. 28, 2016.

* cited by examiner

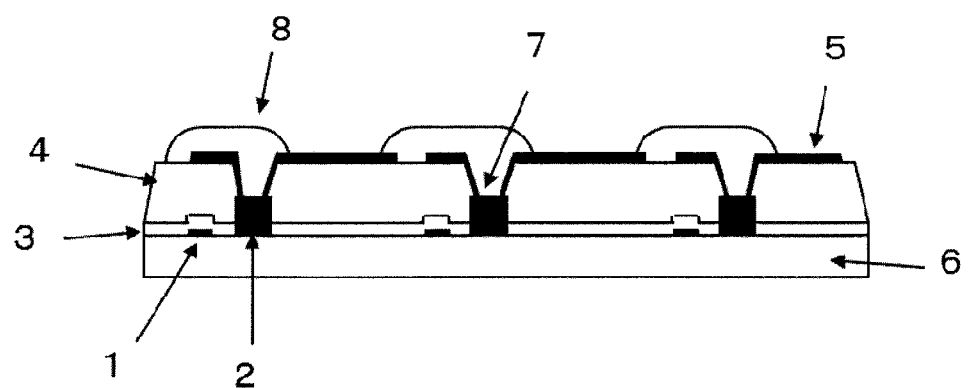

PHOTOSENSITIVE COLORED RESIN COMPOSITION

CROSS REFERENCE TO RELATED APPLICATIONS

This application is a Continuation of PCT International Application No. PCT/JP2016/059936 filed on Mar. 28, 2016, which claims priority under 35 U.S.C. § 119(a) to Patent Application No. 2015-074976 filed in Japan on Apr. 1, 2015, all of which are hereby expressly incorporated by reference into the present application.

TECHNICAL FIELD

The present invention relates to a photosensitive colored resin composition, a heat resistant colored resin film produced therefrom, and a production method therefor. More specifically, it relates to a heat resistant colored resin film suitable for surface protect film and interlayer insulating film for semiconductor elements, insulating layers for organic electroluminescence (hereinafter abbreviated as EL) elements, planarizing film for the substrate of thin film transistors (hereinafter abbreviated as TFT) to drive displaying components containing organic EL elements, wiring-protecting insulating film for circuit boards, on-chip microlens in solid state image sensing devices, planarizing film for various display and solid imaging devices, and solder mask for circuit board production, and further relates to a photosensitive colored resin composition to be used for production thereof.

BACKGROUND ART

Cured films produced by curing a composition formed mainly of an alkali soluble resin that contains polyimide or polybenzoxazole have been widely used as insulating film, protecting film, barrier rib, planarizing film for semiconductor elements and displaying devices, etc. In reflection of the recent increasing demand for high resolution semiconductor elements and display devices, various components including insulating film, protecting film, and planarizing film are now required to have resolutions of several micrometers. To meet these requirements and also realize more simplified production processes, positive type photosensitive resin compositions suitable for fine processing are now widely used. In order to prevent problems such as deterioration, malfunction, and leakage current due to light entering the TFT that drives a display device, furthermore, cured films to be used as insulating layer of an organic EL display or planarizing film provided on the TFT substrate of an organic EL display are required to have a reduced light transmittance particular in the wavelength range of 450 nm or less. When applying a photosensitive resin composition to a display device, for example, there is a call for improving the contrast and solving the problem of visibility deterioration attributed to external light reflection during outdoor use in the case of the insulating layer of an organic EL display or black matrix layer in a liquid crystal display and reducing the light transmittance for visible light in the case of cured film used in the insulating layer or planarize layer.

Techniques for decreasing the light transmittance of a cured film in the visible light region of 400 nm or more include the addition of a coloring agent such as carbon black, organic or inorganic pigments, and dyes to the resin composition as seen in the fields of black matrix material and RGB paste material for liquid crystal displays.

For positive photosensitive resin compositions, techniques available for decreasing the light transmittance of cured film include, for example, adding a quinone diazide compound and a black pigment to an alkali soluble resin formed of a novolac resin and/or vinyl polymer (for example, see Patent document 1), adding a photosensitive agent and a black pigment to soluble polyimide (for example, see Patent document 2), adding a quinone diazide compound and a coloring matter soluble in both the alkaline developer and organic solvent to an alkali-soluble resin (for example, see Patent document 3), adding a black oil-soluble dye to a photosensitive resin (for example, see Patent document 4), and adding an esterified quinone diazide compound and at least one coloring agent selected from the group consisting of dye, inorganic pigment, and organic pigment to an alkali-soluble heat resistant resin (for example, see Patent document 5).

PRIOR ART DOCUMENTS

Patent Documents

Patent document 1: Japanese Unexamined Patent Publication (Kokai) No. HEI 6-230215
Patent document 2: Japanese Unexamined Patent Publication (Kokai) No. 2003-119381
Patent document 3: Japanese Unexamined Patent Publication (Kokai) No. HEI 7-261015
Patent document 4: Japanese Unexamined Patent Publication (Kokai) No. HEI 10-254129
Patent document 4: Japanese Unexamined Patent Publication (Kokai) No. 2003-119381
Patent document 5: Japanese Unexamined Patent Publication (Kokai) No. 2004-145320

SUMMARY OF THE INVENTION

Problems to be Solved by the Invention

However, photosensitive resin compositions based on the above techniques contain, in addition to photosensitive compounds, compounds that absorb light in the wavelength region of 350 nm to 450 nm, which is generally used for light exposure, leading to the problem of deterioration in exposure sensitivity that can cause a large decrease in throughput.

An object of the present invention is to provide a photosensitive colored resin composition that can achieve a reduction in light transmittance in the visible light region of 400 nm or more and an increase in the sensitivity to broadband exposure particularly in the wavelength region from 350 nm to 450 nm, which contains the g-line (436 nm), the h-line (405 nm), and the i-line (365 nm), and also provide a heat resistant colored resin film produced therefrom.

Means of Solving the Problems

Specifically, the present invention relates to a photosensitive colored resin composition including an alkali-soluble resin (a), a photosensitive compound (b), and a compound (c) having an absorption maximum in the wavelength range of 400 nm or more and less than 490 nm, the photosensitive compound (b) containing a photosensitive compound (b1), the photosensitive compound (b1) being such that its maximum absorption wavelength in the range of 350 nm or more and 450 nm or less is located within the wavelength range of 350 nm or more and 390 nm or less.

The photosensitive colored resin composition may further include a compound (d) having an absorption maximum in the wavelength range of 490 nm or more and less than 580 nm and a compound (e) having an absorption maximum in the wavelength range of 580 nm or more and less than 800 nm.

The present invention also relates to a production method for heat resistant colored resin film including a coating step for coating a substrate with a photosensitive colored resin composition to form a coating film, a drying step for drying the coating film, a light exposure step for exposing the dried photosensitive colored resin film to light, a development step for developing the exposed photosensitive colored resin film, and a heat treatment step for heat-treating the developed photosensitive colored resin film.

The present invention also provides a display element including a first electrode formed on a substrate, an insulating layer formed to cover the periphery of the first electrode, and a second electrode formed to face the first electrode, the insulating layer being a heat-resistant colored resin film formed mainly of the photosensitive colored resin composition according to the present invention.

Another aspect of the present invention provides a display device including a thin film transistor (TFT) having wiring formed on a substrate, a planarizing film provided so as to cover irregularities on the TFT having wiring, and a display element formed on the planarizing film, the planarizing film being a heat-resistant colored resin film formed mainly of the photosensitive colored resin composition according to the present invention.

Advantageous Effect of the Invention

According to the present invention, it is possible to provide a photosensitive colored resin composition that can reduce the light transmittance in the visible light region of 400 nm or more and has a high sensitivity to light in the wavelength range from 350 nm to 450 nm, which is generally used for light exposure, particularly in the so-called broadband wavelength range that contains the g-line (436 nm), h-line (405 nm), and i-line (365 nm). Accordingly, the use of the photosensitive colored resin composition according to the present invention enables an increase in the throughput of a process for producing a heat resistant colored resin film. Furthermore, for a display device using the heat resistant colored resin film, it is possible to prevent degradation, malfunction, and leakage current caused by light entering the TFT that drives the device. Furthermore, visibility deterioration attributed to external light reflection during outdoor use can be reduced to improve the reliability of the display device.

BRIEF DESCRIPTION OF THE DRAWINGS

FIG. 1 A cross section of a TFT substrate

DESCRIPTION OF PREFERRED EMBODIMENTS

The invention is described in detail below.

The present invention relates to a photosensitive colored resin composition including an alkali-soluble resin (a), a photosensitive compound (b), and a compound (c) having an absorption maximum in the wavelength range of 400 nm or more and less than 490 nm, the photosensitive compound (b) containing a photosensitive compound (b1), the photosensitive compound (b1) being such that its maximum absorption wavelength in the range of 350 nm or more and 450 nm or less is located within the wavelength range of 350 nm or more and 390 nm or less.

The photosensitive colored resin composition according to the present invention contains an alkali-soluble resin (a).

For the present invention, an alkali-soluble resin means a resin dissolution speed, which is defined below, of 50 nm/min or more. More specifically, the resin is such that when a solution prepared by dissolving it in γ-butyrolactone is spread on a silicon wafer and prebaked at 120° C. for 4 minutes to form a prebaked film with a film thickness of 10 μm±0.5 μm, followed by immersing the prebaked film in a 2.38 mass % aqueous solution of tetramethyl ammonium hydroxide at 23±1° C. for 1 minute and rinsing it in pure water, the dissolution speed determined from the decrease in film thickness is 50 nm/min or more.

The alkali-soluble resin (a) used for the present invention preferably has an alkali-soluble group in the structural unit and/or at the backbone chain terminal of the resin to impart solubility in alkalis. An alkali-soluble group as referred to here is a functional group that acts to increase the solubility in an alkali solution by undergoing interaction or reaction with the alkali, and specific examples include acidic groups. Preferable alkali-soluble groups include carboxyl groups, phenolic hydroxyl groups, sulfonic groups, and thiol groups.

Specific examples of the alkali-soluble resin (a) used for the present invention include polyimides, polyimide precursors, polybenzoxazoles, polybenzoxazole precursors, phenol resins, polymers containing a radical polymerizable monomer having an alkali-soluble group, siloxane polymers, cyclic olefin polymers, and cardo resins. Each of these resins may be used singly or a plurality of the resins may be used in combination. In particular, those with high heat resistance are preferable. In addition, those with smaller outgassing at high temperatures above 200° C. after heat treatment are preferable to ensure good characteristics for serving as planarizing film, insulating layer, barrier rib, or protecting film in an organic luminescence apparatus, display device, or semiconductor element. As a preferable example, it may be at least one alkali-soluble resin selected from the group consisting of polyimides, polyimide precursors, and polybenzoxazole precursors, or a copolymer thereof.

Such polyimides, polyimide precursors, polybenzoxazoles, and polybenzoxazole precursors that are preferred as alkali-soluble resin (a) are described below. There are no specific limitations on the polyimides and polybenzoxazoles as long as they have an imide ring or a benzoxazole ring, respectively. There are no specific limitations on the polyimide precursors as long as they have a structure that can form an imide ring-containing polyimide when undergoing dehydration cyclization, and no specific limitations on the polybenzoxazole precursors as long as they have a structure that can form a benzoxazole ring-containing polybenzoxazole when undergoing dehydration cyclization.

More preferable examples of the alkali-soluble resin (a) include polyimides, polyimide precursors, and polybenzoxazole precursors. Such a polyimide has a structural unit as represented by general formula (1) given blow, whereas such a polyimide precursor and polybenzoxazole precursor has a structural unit as represented by general formula (2) given blow. Two or more of these may be contained and a copolymer resin of a structural unit represented by general formula (1) and a structural unit represented by general formula (2) may be used.

[Chemical compound 1]

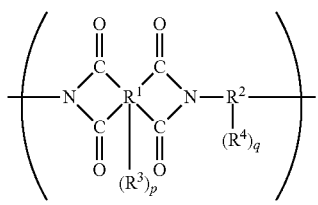

(1)

(In general formula (1), $R^1$ represents a tetravalent to decavalent organic group and $R^2$ represents a divalent to octavalent organic group. $R^3$ and $R^4$ each represent a phenolic hydroxyl group, carboxy group, sulfonic group, or thiol group and may be a single group or a combination of different ones thereof. Furthermore, p and q each represent an integer of 0 to 6.)

[Chemical compound 2]

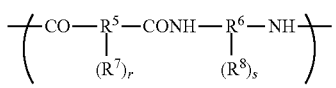

(2)

(In general formula (2), $R^5$ represents a divalent to octavalent organic group and $R^6$ represents a divalent to octavalent organic group. $R^7$ and $R^8$ each represent a phenolic hydroxyl group, sulfonic group, thiol group, or $COOR^9$ and may be a single group or a combination of different ones thereof. $R^9$ denotes a hydrogen atom or a monovalent hydrocarbon group containing 1 to 20 carbon atoms. Furthermore, r and s each represent an integer of 0 to 6. They meet the relation of r+s>0.)

The alkali-soluble resin selected from the group consisting polyimides, polyimide precursors, and polybenzoxazole precursors, or the copolymer thereof preferably contains 5 to 100,000 structural units that are represented by general formula (1) or (2). It may contain another structural unit in addition to the structural units that are represented by general formula (1) or (2). In this case, the main constituent unit is preferably one represented by general formula (1) or (2). Here, the main constituent unit is one that accounts for 50 mol % or more, preferably 70 mol % or more, of the total structural units.

In general formula (1) given above, $R^1$—$(R^3)_p$ represents an acid dianhydride residue. $R^1$ is a tetravalent to decavalent organic group and in particular, it is preferably an organic group containing 5 to 40 carbon atoms and having an aromatic ring or a cycloaliphatic group.

Specific examples of the acid dianhydride include pyromellitic acid dianhydride, 3,3',4,4'-biphenyl tetracarboxylic acid dianhydride, 2,3,3',4'-biphenyl tetracarboxylic acid dianhydride, 2,2',3,3'-biphenyl tetracarboxylic acid dianhydride, 3,3',4,4'-benzophenone tetracarboxylic acid dianhydride, 2,2',3,3'-benzophenone tetracarboxylic acid dianhydride, 2,2-bis(3,4-dicarboxyphenyl) propane dianhydride, 2,2-bis(2,3-dicarboxyphenyl) propane dianhydride, 1,1-bis(3,4-dicarboxyphenyl) ethane dianhydride, 1,1-bis(2,3-dicarboxyphenyl) ethane dianhydride, bis(3,4-dicarboxyphenyl) methane dianhydride, bis(2,3-dicarboxyphenyl) methane dianhydride, bis(3,4-dicarboxyphenyl) ether dianhydride, 1,2,5,6-naphthalene tetracarboxylic acid dianhydride, 9,9-bis(3,4-dicarboxyphenyl) fluorene acid dianhydride, 9,9-bis{4-(3,4-dicarboxyphenoxy) phenyl} fluorene acid dianhydride, 2,3,6,7-naphthalene tetracarboxylic acid dianhydride, 2,3,5,6-pyridine tetracarboxylic acid dianhydride, 3,4,9,10-perylene tetracarboxylic acid dianhydride, and 2,2-bis(3,4-dicarboxyphenyl) hexafluoropropane dianhydride, as well as aromatic tetracarboxylic acid dianhydrides such as those dianhydrides having structures as shown below and aliphatic tetracarboxylic acid dianhydrides such as butane tetracarboxylic acid dianhydride and 1,2,3,4-cyclopentane tetracarboxylic acid dianhydride. Two or more of them may be used in combination.

[Chemical compound 3]

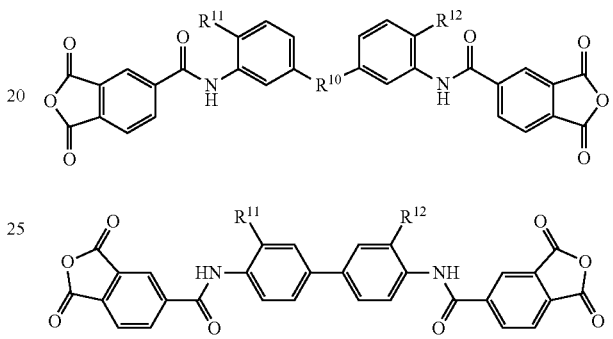

In the formulae, $R^{10}$ is an oxygen atom, $C(CF_3)_2$, or $C(CH_3)_2$. $R^{11}$ and $R^{12}$ are independently a hydrogen atom or a hydroxyl group.

In general formula (2) given above, $R^5$—$(R^7)_r$ represents an acid residue. $R^5$ is a divalent to octavalent organic group and in particular, it is preferably an organic group containing 5 to 40 carbon atoms and having an aromatic ring or a cycloaliphatic group.

Examples of the component represent in the acid residue include dicarboxylic acids such as terephthalic acid, isophthalic acid, diphenyl ether dicarboxylic acid, bis(carboxyphenyl) hexafluoropropane, biphenyl dicarboxylic acid, benzophenone dicarboxylic acid, and triphenyl dicarboxylic acid; tricarboxylic acids such as trimellitic acid, trimesic acid, diphenyl ether tricarboxylic acid, and biphenyl tricarboxylic acid; and tetracarboxylic acids including aromatic tetracarboxylic acids such as pyromellitic acid, 3,3',4,4'-biphenyl tetracarboxylic acid, 2,3,3',4'-biphenyl tetracarboxylic acid, 2,2',3,3'-biphenyl tetracarboxylic acid, 3,3',4,4'-benzophenone tetracarboxylic acid, 2,2',3,3'-benzophenone tetracarboxylic acid, 2,2-bis(3,4-dicarboxyphenyl) hexafluoropropane, 2,2-bis(2,3-dicarboxyphenyl) hexafluoropropane, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) ether, 1,2,5,6-naphthalene tetracarboxylic acid, 2,3,6,7-naphthalene tetracarboxylic acid, 2,3,5,6-pyridine tetracarboxylic acid, 3,4,9,10-perylene tetracarboxylic acid, and the structures shown below, and aliphatic tetracarboxylic acids such as butane tetracarboxylic acid and 1,2,3,4-cyclopentane tetracarboxylic acid. Two or more of them may be used in combination.

[Chemical compound 4]

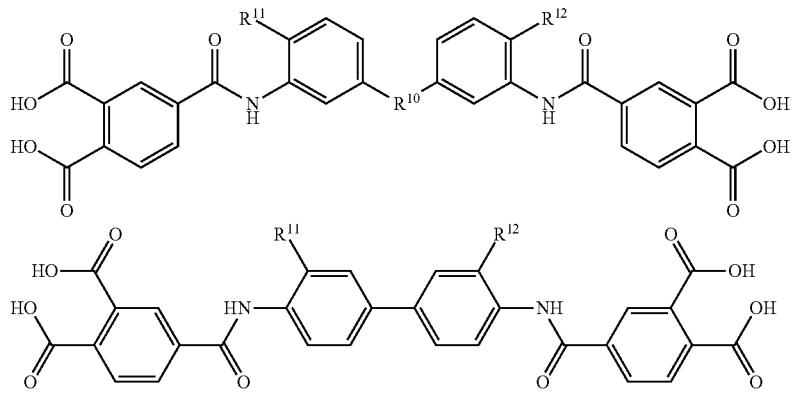

In the formula, $R^{10}$ is an oxygen atom, $C(CF_3)_2$, or $C(CH_3)_2$. $R^{11}$ and $R^{12}$ are independently a hydrogen atom or a hydroxyl group.

In the tricarboxylic acids and tetracarboxylic acids, in particular, one or two carboxyl groups correspond to the $R^7$ group in general formula (2). In the dicarboxylic acids, tricarboxylic acids, and tetracarboxylic acids given above, it is preferable for one to four hydrogen atoms to be substituted by $R^7$ groups in general formula (2), more preferably by hydroxyl groups. These acids may be used in their original form or in the form of an acid anhydride or an active ester.

$R^2$—$(R^4)_q$ in general formula (1) given above and $R^6$—$(R^8)_s$ in general formula (2) given above each represents a diamine residue. $R^2$ and $R^6$ each are a divalent to octavalent organic group and in particular, it is preferably an organic group containing 5 to 40 carbon atoms and having an aromatic ring or a cycloaliphatic group.

Specific examples of the diamine present in a diamine residue include 3,4'-diaminodiphenyl ether, 4,4'-diaminodiphenyl ether, 3,4'-diaminodiphenyl methane, 4,4'-diaminodiphenyl methane, 1,4-bis(4-aminophenoxy) benzene, benzidine, m-phenylene diamine, p-phenylene diamine, 1,5-naphthalene diamine, 2,6-naphthalene diamine, bis(4-aminophenoxy) biphenyl, bis{4-(4-aminophenoxy) phenyl} ether, 1,4-bis(4-aminophenoxy) benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, and 9,9-bis(4-aminophenyl) fluorine; compounds listed above in which at least part of the hydrogen atoms in the aromatic rings are substituted by alkyl groups or halogen atoms; aliphatic cyclohexyl diamines and methylene biscyclohexyl amines; and diamines having structures as shown below. Two or more of them may be used in combination.

[Chemical compound 5]

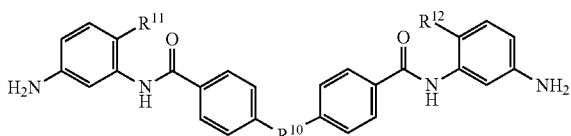

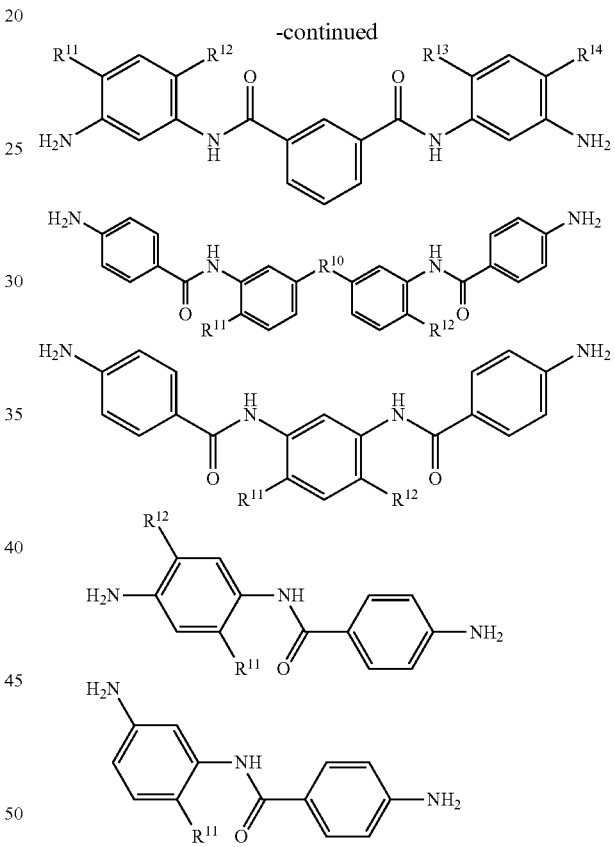

In the formula, $R^{10}$ is an oxygen atom, $C(CF_3)_2$, or $C(CH_3)_2$. $R^{11}$ to $R^{14}$ are independently a hydrogen atom or a hydroxyl group.

These diamines may be used in the form of the original diamines or in the form of corresponding diisocyanate compounds or trimethylsilylated diamines.

The chain ends of these alkali-soluble resins may be capped by a monoamine having an acidic group, acid anhydride, acid chloride, or monocarboxylic acid to form an alkali-soluble resin having an acidic group at the backbone chain end.

Preferable examples of monoamines having these acidic groups include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxy pyrimidine, 2-aminophenol, 3-aminophenol, 4-aminophenol, 2-amino-thiophenol, 3-aminothiophenol, and 4-aminothiophenol. Two or more of them may be used in combination.

Preferable examples of these acid anhydrides, acid chlorides, and monocarboxylic acids include acid anhydrides such as phthalic acid anhydride, maleic acid anhydride, nadic acid anhydride, cyclohexanedicarboxylic acid anhydride, and 3-hydroxyphthalic acid anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, and 1-mercapto-5-carboxynaphthalene; those monoacid chloride compounds that can be produced from the former by converting their carboxyl group into an acid chloride group; those monoacid chloride compounds that can be produced from dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene by converting only one of their carboxyl groups into an acid chloride group; and active ester compounds that can be produced by reacting a monoacid chloride compound with N-hydroxybenzotriazole or N-hydroxy-5-norbornene-2,3-dicarboxyimide. Two or more of them may be used in combination.

The aforementioned end capping agents such as monoamine having an acidic group, acid anhydride, acid chloride, or monocarboxylic acid preferably account for 2 to 25 mol % of the total quantity, or 100 mol %, of the acids and amine components present in the alkali-soluble resin (a). If their content is maintained in this range, it will be possible to produce a photosensitive colored resin composition that can provide a solution with a suitable viscosity for coating with the photosensitive colored resin composition and has good film properties.

End capping agents introduced in an alkali-soluble resin (a) can be detected easily by methods as described below. An alkali-soluble resin (a) containing an end capping agent may be dissolved in, for example, an acidic solution to decompose it into the amine components and acid components, that is, the constituent units of the resin, and then the end capping agent can be detected easily by gas chromatography (GC) and NMR spectroscopy. In another method, detection can be carried out by subjecting the alkali-soluble resin (a) containing an end capping agent directly to pyrolysis gas chromatograph (PGC), infrared spectroscopy, or $^{13}$C-NMR spectroscopy.

An alkali-soluble resin (a) used for the photosensitive colored resin composition according to the present invention can be synthesized by a generally known method. In the case of polyimide precursors such as polyamic acid and polyamic acid ester, available production methods include, for example, a method in which a tetracarboxylic acid dianhydride and a diamine compound are reacted at a low temperature, a method in which a diester is obtained from a tetracarboxylic acid dianhydride and an alcohol, followed by its reaction with an amine in the presence of a condensation agent, a method in which a diester is obtained from a tetracarboxylic acid dianhydride and an alcohol, followed by conversion of the remaining dicarboxylic acid into an acid chloride and its reaction with an amine.

In the case of a polybenzoxazole precursor such as polyhydroxyamide, available production methods include a condensation reaction between a bisaminophenol compound and a dicarboxylic acid. Specifically, available methods include a method in which an acid is reacted with a dehydration condensation agent such as dicyclohexyl carbodiimide (DCC), followed by adding a bisaminophenol compound and a method in which a tertiary amine such as pyridine is added to a solution of a bisaminophenol compound, followed by dropping a solution of a dicarboxylic dichloride.

A polyimide can be produced by, for example, heating a polyamic acid or polyamic acid ester as prepared by the aforementioned method or subjecting it to chemical treatment with an acid or a salt group to cause dehydration cyclization.

A polybenzoxazole can be produced by, for example, heating a polyhydroxyamide as prepared by the aforementioned method or subjecting it to chemical treatment with an acid or a salt group to cause dehydration cyclization.

Described next are phenol resins to be used as the alkali-soluble resin (a) for the present invention. Such phenol resins include novolac resins and resol resins, which can be produced by subjecting a phenol or a mixture of phenols, selected from various available ones, to condensation polymerization with an aldehyde such as formalin.

The phenols that can serve for producing novolac resins or resol resins include, for example phenol, p-cresol, m-cresol, o-cresol, 2,3-dimethyl phenol, 2,4-dimethyl phenol, 2,5-dimethyl phenol, 2,6-dimethyl phenol, 3,4-dimethyl phenol, 3,5-dimethyl phenol, 2,3,4-trimethyl phenol, 2,3,5-trimethyl phenol, 3,4,5-trimethyl phenol, 2,4,5-trimethyl phenol, methylene bisphenol, methylene bisp-cresol, resorcin, catechol, 2-methyl resorcin, 4-methyl resorcin, o-chlorophenol, m-chlorophenol, p-chlorophenol, 2,3-dichlorophenol, m-methoxy phenol, p-methoxy phenol, p-butoxy phenol, o-ethyl phenol, m-ethyl phenol, p-ethyl phenol, 2,3-diethyl phenol, 2,5-diethyl phenol, p-isopropyl phenol, α-naphthol, and β-naphthol, which may be used singly or as a mixture of two or more thereof.

The aldehydes that can be used for condensation polymerization with a novolac resin or resol resin include, in addition to formalin, para-formaldehyde, acetaldehyde, benzaldehyde, hydroxybenzaldehyde, and chloroacetaldehyde, which may be used singly or as a mixture of two or more thereof.

The phenol resins that can be used for the present invention may have a structure formed by replacing some of the hydrogen atoms located on the aromatic ring with one or more components selected from the group consisting of alkyl groups containing 1 to 20 carbon atoms, fluoroalkyl groups, hydroxyl groups, alkoxyl groups, alkoxy methyl groups, methylol groups, carboxyl groups, ester groups, nitro groups, cyano groups, fluorine atom, and chlorine atom.

A phenol resin used for the present invention preferably has a polystyrene based weight average molecular weight in the range of 2,000 to 50,000, more preferably in the range of 3,000 to 30,000, as determined by gel permeation chromatography (GPC). A molecular weight of 2,000 or more ensures a good pattern shape, high resolution, high developability, and high heat resistance, while a molecular weight of 50,000 or less allows a sufficiently high sensitivity to be maintained.

Described next below are polymers containing radical polymerizable monomers having alkali-soluble groups that can be used as the alkali-soluble resin (a) for the present invention.

Monomers such as listed below can serve to synthesize a polymer containing a radical polymerizable monomer having an alkali-soluble group. Such radical polymerizable monomers having a phenolic hydroxyl group or a carboxyl group include, for example, o-hydroxystyrene, m-hydroxystyrene, and p-hydroxystyrene, which may be substituted by an alkyl, alkoxy, alkoxy methyl, methylol, halogen, haloalkyl, nitro, cyano, amide, ester, or carboxy group; polyhydroxyvinyl phenols such as vinyl hydroquinone, 5-vinyl pyrogallol, 6-vinyl pyrogallol, and 1-vinyl fluoroglycinol; o-vinyl benzoic acid, m-vinyl benzoic acid, and p-vinyl benzoic acid, which may be substituted by an alkyl, alkoxy, alkoxy methyl, methylol, halogen, nitro, cyano, amide, or ester group; methacrylic acid and acrylic acid, which may be substituted by an α-haloalkyl, alkoxy, halogen, nitro, or cyano group; divalent unsaturated carboxylic acids such as maleic acid, maleic anhydride, fumaric acid, fumaric anhydride, citraconic acid, mesaconic acid, itaconic acid, and 1,4-cyclohexene dicarboxylic acid, as well as methyl, ethyl, propyl, i-propyl, n-butyl, sec-butyl, ter-butyl, phenyl, and o-, m-, p-toluyl half esters and half amides thereof.

Of these, o-hydroxystyrene, m-hydroxystyrene, and p-hydroxystyrene, which may be substituted by an alkyl, alkoxy, alkoxy methyl, or methylol group, are preferred from the viewpoint of the sensitivity during patterning, resolution, residual film percentage after development, heat resistance, and storage stability of solutions. These may be used singly or as a combination of two or more thereof.

Preferable examples of other radical polymerizable monomers include styrene, which may be substituted at the α-, o-, m-, or p-position by alkyl, alkoxy, alkoxy methyl, methylol, halogen, haloalkyl, nitro, cyano, amide, or ester; diolefins such as butadiene, isoprene, and chloroprene; methacrylic acids and acrylic acids esterified with methyl, ethyl, n-propyl, i-propyl, n-butyl, sec-butyl, ter-butyl, pentyl, neopentyl, isoamyl hexyl, cyclohexyl, adamanthyl, allyl, propargyl, phenyl, naphthyl, anthracenyl, anthraquinonyl, piperonyl, salicyl, cyclohexyl, benzyl, phenethyl, cresyl, glycidyl, 1,1,1-trifluoro ethyl, perfluoro ethyl, perfluoro-n-propyl, perfluoro-i-propyl, triphenyl methyl, tricyclo [$5.2.1.0^{2,6}$] decane-8-yl (conventionally called dicyclopentenyl), cumyl, 3-(N,N-dimethylamino) propyl, 3-(N,N-dimethylamino) ethyl, furyl, or furfuryl; anilides and amides of methacrylic acid or acrylic acid; and N,N-dimethyl, N,N-diethyl, N,N-dipropyl, N,N-diisopropyl, anthranilamide, acrylonitrile, acrolein, methacrylonitrile, vinyl chloride, vinylidene chloride, vinyl fluoride, vinylidene fluoride, N-vinyl pyrolidone, vinyl pyridine, vinyl acetate, N-phenyl maleinimide, N-(4-hydroxyphenyl) maleinimide, N-methacryloyl phthalimide, and N-acryloyl phthalimide. These may be used singly or as a combination of two or more thereof.

Of the above ones, more preferable examples of other radical polymerizable monomers are styrene, which may be substituted at the α-, o-, m-, or p-position by alkyl, alkoxy, alkoxy methyl, methylol, halogen, or haloalkyl; butadiene and isoprene; methacrylic acids and acrylic acids esterified with methyl, ethyl, n-propyl, N-butyl, glycidyl, or tricyclo [$5.2.1.0^{2,6}$] decane-8-yl, which are preferred from the viewpoint of the sensitivity during patterning, resolution, residual film percentage after development, heat resistance, resistance to solvents, contact with substrates, and storage stability of solutions.

When a copolymer of a radical polymerizable monomer having a phenolic hydroxyl group and another radical polymerizable monomer is used as alkali-soluble resin (a), such another radical polymerizable monomer preferably accounts for 5 parts by mass or more of the total quantity of the radical polymerizable monomer having a phenolic hydroxyl group and such another radical polymerizable monomer. The proportion is preferably 30 parts by mass or less, more preferably 20 parts by mass or less. For such another radical polymerizable monomer, a proportion of 5 parts by mass or more is preferable because heat resistance and chemical resistance will improve. A proportion of 30 parts by mass or less is preferable because alkali development will be easy to perform. When a copolymer of a radical polymerizable monomer having a carboxyl group and another radical polymerizable monomer is used as alkali-soluble resin, such another radical polymerizable monomer preferably accounts for 10 parts by mass or more of the total quantity of the radical polymerizable monomer having a carboxyl group and such another radical polymerizable monomer. The proportion is preferably 90 parts by mass or less, more preferably 80 parts by mass or less. For such another radical polymerizable monomer, a proportion of 10 parts by mass or more is preferable because heat resistance and chemical resistance will improve. A proportion of 90 parts by mass or less is preferable because alkali development will be easy to perform.

Useful polymerization initiators for the production of a polymer containing a radical polymerizable monomer having an alkali-soluble group include, for example, azo compounds such as 2,2'-azobisisobutyronitrile, 2,2'-azo-bis-(2,4-dimethyl valeronitrile), and 2,2'-azo-bis-(4-methoxy-2,4-dimethyl valeronitrile); organic peroxides such as benzoyl peroxide, lauroyl peroxide, t-butyl peroxypivalate, and 1,1'-bis-(t-butyl peroxy) cyclohexane; and hydrogen peroxide. When a peroxide is used as a radical polymerization initiator, the peroxide may be used in combination with a reduction agent to serve as a redox type initiator.

Such a polymer containing a radical polymerizable monomer having an alkali-soluble group preferably has a polystyrene based weight average molecular weight of 2,000 to 100,000, more preferably 3,000 to 50,000, particularly preferably 5,000 to 30,000, as determined by gel permeation chromatography. A weight average molecular weight of 2,000 or more ensures a good pattern shape, high resolution, high developability, and high heat resistance, while a weight average molecular weight of less than 100,000 allows a high developability and sensitivity to be maintained.

These polymers containing a radical polymerizable monomer having an alkali-soluble group may be used singly or as a combination of two or more thereof. Another good alkali-soluble resin synthesis method is to introduce a protective group in the carboxyl group or phenolic hydroxyl group before polymerization and remove the protective group after polymerization to develop alkali-soluble property. In addition, the transparency to visible light and the softening point may be controlled by treatments such as hydrogenation.

Described next are siloxane polymers to be used as the alkali-soluble resin (a) for the present invention. A siloxane polymer as referred to for the present invention is one produced through hydrolysis condensation of at least one compound selected from the organosilanes represented by general formula (3) and the organosilanes represented by general formula (4). The use of organosilanes represented by general formula (3) or (4) serves to obtain a photosensitive colored resin composition having a high sensitivity and resolution.

Organosilanes as represented by general formula (3) used for the present invention are as described below.

[Amendment 03.08.2016 According to Regulation 91]

[Chemical compound 6]

$$(R^{15})_m Si(OR^{16})_{4-m} \quad (3)$$

(In the above general formula (3), $R^{15}$ represents a hydrogen atom, alkyl group having 1 to 10 carbon atoms, alkenyl group having 2 to 10 carbon atoms, or aryl group having 6 to 16 carbon atoms. $R^{16}$ represents a hydrogen atom, alkyl group having 1 to 6 carbon atoms, acyl group having 2 to 6 carbon atoms, or aryl group having 6 to 16 carbon atoms. And m represents an integer of 0 to 3. When m is 2 or more, the plurality of components $R^{15}$ may be identical to or different from each other. When m is 2 or less, the plurality of $R^{16}$'s may be identical to or different from each other.)

Specific examples of the organosilanes represented by general formula (3) include tetrafunctional silanes such as tetramethoxysilane, tetraethoxysilane, tetraacetoxysilane, and tetraphenoxysilane; trifunctional silanes such as methyl trimethoxysilane, methyl triethoxysilane, methyl triisopropoxysilane, methyl tri-n-butoxysilane, ethyl trimethoxysilane, ethyl triethoxysilane, ethyl triisopropoxysilane, ethyl tri-n-butoxysilane, n-propyl trimethoxysilane, n-propyl triethoxysilane, n-butyl trimethoxysilane, n-butyl triethoxysilane, n-hexyl trimethoxysilane, n-hexyl triethoxysilane, decyl trimethoxysilane, vinyl trimethoxysilane, vinyl triethoxysilane, 3-methacryloxy propyl trimethoxysilane, 3-methacryloxy propyl triethoxysilane, 3-acryloxy propyl trimethoxysilane, phenyl trimethoxysilane, phenyl triethoxysilane, p-hydroxyphenyl trimethoxysilane, 1-(p-hydroxyphenyl) ethyl trimethoxysilane, 2-(p-hydroxyphenyl) ethyl trimethoxysilane, 4-hydroxy-5-(p-hydroxyphenyl carbonyloxy) pentyl trimethoxysilane, trifluoromethyl trimethoxysilane, trifluoromethyl triethoxysilane, 3,3,3-trifluoropropyl trimethoxysilane, 3-aminopropyl trimethoxysilane, 3-aminopropyl triethoxysilane, 3-glycidoxy propyl trimethoxysilane, 3-glycidoxypropyl triethoxysilane, 2-(3,4-epoxycyclohexyl) ethyl trimethoxysilane, 2-(3,4-epoxy cyclohexyl) ethyl triethoxysilane, [(3-ethyl-3-oxetanyl) methoxy]propyl trimethoxysilane, [(3-ethyl-3-oxetanyl) methoxy]propyl triethoxysilane, 3-mercaptopropyl trimethoxysilane, 3-trimethoxysilyl propyl succinate, 1-naphthyl trimethoxysilane, 1-naphthyl triethoxysilane, 1-naphthyl tri-n-propoxysilane, 2-naphthyl trimethoxysilane, 1-anthracenyl trimethoxysilane, 9-anthracenyl trimethoxysilane, 9-phenanthrenyl trimethoxysilane, 9-fluorenyl trimethoxysilane, 2-fluorenyl trimethoxysilane, 1-pyrenyl trimethoxysilane, 2-indenyl trimethoxysilane, and 5-acenaphthenyl trimethoxysilane; difunctional silanes such as dimethyl dimethoxysilane, dimethyl diethoxysilane, dimethyl diacetoxysilane, di-n-butyl dimethoxysilane, diphenyl dimethoxysilane, (3-glycidoxypropyl) methyl dimethoxysilane, (3-glycidoxypropyl) methyl diethoxysilane, di(1-naphthyl) dimethoxysilane, and di(1-naphthyl) diethoxysilane; and monofunctional silanes such as trimethyl methoxysilane, tri-n-butyl ethoxysilane, (3-glycidoxypropyl) dimethyl methoxysilane, and (3-glycidoxy propyl) dimethyl ethoxysilane. Two or more of these organosilanes may be used in combination.

Organosilanes as represented by general formula (4) used for the present invention are as described below.

[Amendment 03.08.2016 According to Regulation 91]

[Chemical compound 7]

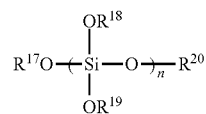

(4)

(In the above general formula (4), $R^{17}$ to $R^{20}$ independently represent a hydrogen atom, alkyl group having 1 to 6 carbon atoms, acyl group having 2 to 6 carbon atoms, or aryl group having 6 to 16 carbon atoms. And n represents an integer in the range of 2 to 8. When n is 2 or more, the plurality of components $R^{18}$ and $R^{19}$ may be identical to or different from each other.)

Specific examples of organosilanes as represented by the above general formula (4) include Methyl Silicate 51 ($R^{17}$ to $R^{20}$: methyl group, n=4 on the average) manufactured by Fuso Chemical Co., Ltd.; M Silicate 51 ($R^{17}$ to $R^{20}$: methyl group, n=3 to 5 on the average), Silicate 40 ($R^{17}$ to $R^{20}$: ethyl group, n=4 to 6 on the average), and Silicate 45 ($R^{17}$ to $R^{20}$: ethyl group, n=6 to 8 on the average) manufactured by Tama Chemicals Co., Ltd.; and Methyl Silicate 51 ($R^{17}$ to $R^{20}$: methyl group, n=4 on the average), Methyl Silicate 53 A ($R^{17}$ to $R^{20}$: methyl group, n=7 on the average), and Ethyl Silicate 40 ($R^{17}$ to $R^{20}$: ethyl group, n=5 on the average) manufactured by Colcoat Co., Ltd., which are available from each manufacturer. Two or more of them may be used in combination.

For a siloxane polymer, the content of Si atoms originating from an organosilane as represented by general formula (3) or general formula (4) is determined by identifying the structure of the organosilane used as raw material by an appropriate method such as $^1$H-NMR, $^{13}$C-NMR, $^{29}$Si-NMR, IR, and TOF-MS and calculating the integrated peak ratio between the Si—C bond derived peak and the Si—O bond derived peak in the IR spectrum.

There are no specific limitations on the weight average molecular weight (Mw) of the siloxane polymer, but the polystyrene based value is preferably 1,000 or more as determined by GPC (gel permeation chromatography) to ensure improved coating performance. From the viewpoint of solubility in developers, on the other hand, it is preferably 100,000 or less, and more preferably 50,000 or less.

A siloxane polymer to be used for the present invention can be synthesized through hydrolysis and partial condensation of monomers such as organosilanes as represented by general formula (3) or (4). Here, a partial condensation step is designed so that part of the Si—OH bonds in the hydrolysate will remain in the resulting siloxane polymer, instead of entire condensation of the Si—OH bonds. Hydrolysis and partial condensation can be carried out by generally known methods. For example, a typical method is to add a solvent, water, and, when required, catalyst to an organosilane mixture, which is then stirred for 0.5 to 100 hours or so while heating at 50 to 150° C. During the stirring, hydrolysis by-products (alcohols such as methanol) and condensation by-products (water) may be evaporated by distillation, as required.

There are no specific limitations on the catalyst to be used, but preferable ones include acid catalysts and base catalysts. Specific examples of the acid catalysts include hydrochloric acid, nitric acid, sulfuric acid, hydrofluoric acid, phosphoric acid, acetic acid, trifluoro acetic acid, formic acid, multivalent carboxylic acid, and anhydrides thereof, as well as ion exchange resins. Specific examples of the base catalysts include triethyl amine, tripropyl amine, tributyl amine, tripentyl amine, trihexyl amine, triheptyl amine, trioctyl amine, diethyl amine, triethanol amine, diethanol amine, sodium hydroxide, potassium hydroxide, amino-containing alkoxysilanes, and ion exchange resins.

From the viewpoint of storage stability of the photosensitive resin composition, the siloxane polymer solution obtained after the hydrolysis and partial condensations steps is preferably free of these catalysts, and therefore the catalysts should preferably be removed as required. There are no specific limitations on the removal method to be used, but it is preferable to adopt rinsing and/or ion exchange resin treatment from the viewpoint of simple operation and removal performance. In a rinsing step, the siloxane polymer solution is diluted with an appropriate hydrophobic solvent and then rinsed with water a few times, followed by condensing the resulting organic layer by using, for example, an evaporator. In an ion exchange resin treatment step, the siloxane polymer solution is brought into contact with an appropriate ion exchange resin.

Described next are cyclic olefin polymers to be used as the alkali-soluble resin (a) for the present invention. For the present invention, a cyclic olefin polymer is a homopolymer or copolymer that includes a cyclic olefin monomer having a cyclic structure (alicyclic or aromatic ring) and a carbon-carbon double bond. Such a cyclic olefin polymer may also include a monomer that is not a cyclic olefin monomer Monomers that can be used to constitute such a cyclic olefin polymer include cyclic olefin monomers having protonic polar groups, cyclic olefin monomers having non-protonic polar group, cyclic olefin monomers having no polar groups, and non-cyclic-olefin monomers. Here, such non-cyclic-olefin monomers may have protonic polar groups or other polar groups or may be free of polar groups.

Specific examples of the cyclic olefin monomers having protonic polar groups include cyclic olefins containing carboxyl groups such as 5-hydroxycarbonyl bicyclo[2.2.1]hept-2-en, 5-methyl-5-hydroxycarbonyl bicyclo[2.2.1]hept-2-en, 5-carboxymethyl-5-hydroxycarbonyl bicyclo[2.2.1]hept-2-en, 5-exo-6-endo-dihydroxycarbonyl bicyclo[2.2.1]hept-2-en, 8-hydroxycarbonyl tetracyclo[4.4.0.1$^{2,5}$.1$^{7,10}$]dodeca-3-en, 8-methyl-8-hydroxycarbonyl tetracyclo[4.4.0.1$^{2,5}$.1$^{7,10}$]dodeca-3-en, and 8-exo-9-endo-dihydroxycarbonyl tetracyclo[4.4.0.1$^{2,5}$.1$^{7,10}$]dodeca-3-en; and cyclic olefins containing hydroxyl groups such as 5-(4-hydroxyphenyl) bicyclo[2.2.1]hept-2-en, 5-methyl-5-(4-hydroxyphenyl) bicyclo[2.2.1]hept-2-en, 8-(4-hydroxyphenyl) tetracyclo[4.4.0.1$^{2,5}$.1$^{7,10}$]dodeca-3-en, and 8-methyl-8-(4-hydroxyphenyl) tetracyclo[4.4.0.1$^{2,5}$.1$^{7,10}$]dodeca-3-en. These monomers may be used singly, or two or more thereof may be used in combination.

Specific examples of the cyclic olefin monomers having non-protonic polar groups include cyclic olefins having ester groups such as 5-acetoxy bicyclo[2.2.1]hept-2-en, 5-methoxycarbonyl bicyclo[2.2.1]hept-2-en, 5-methyl-5-methoxycarbonyl bicyclo[2.2.1]hept-2-en, 8-acetoxy tetracyclo[4.4.0.1$^{2,5}$.1$^{7,10}$]dodeca-3-en, 8-methoxycarbonyl tetracyclo[4.4.0.1$^{2,5}$.1$^{7,10}$]dodeca-3-en, 8-ethoxycarbonyl tetracyclo[4.4.0.1$^{2,5}$.1$^{7,10}$]dodeca-3-en, 8-n-propoxycarbonyl tetracyclo[4.4.0.11$^{2,5}$.1$^{7,10}$]dodeca-3-en, 8-isopropoxycarbonyl tetracyclo[4.4.0.1$^{2,5}$.1$^{7,10}$]dodeca-3-en, 8-n-butoxycarbonyl tetracyclo[4.4.0.1$^{2,5}$.1$^{7,10}$]dodeca-3-en, 8-methyl-8-methoxycarbonyl tetracyclo[4.4.0.1$^{2,5}$.1$^{7,10}$]dodeca-3-en, 8-methyl-8-ethoxycarbonyl tetracyclo[4.4.0.1$^{2,5}$.1$^{7,10}$]dodeca-3-en, 8-methyl-8-n-propoxycarbonyl tetracyclo[4.4.0.1$^{2,5}$.1$^{7,10}$]dodeca-3-en, 8-methyl-8-isopropoxycarbonyl tetracyclo[4.4.0.1$^{2,5}$.1$^{7,10}$]dodeca-3-en, 8-methyl-8-n-butoxycarbonyl tetracyclo[4.4.0.1$^{2,5}$.1$^{7,10}$]dodeca-3-en, 8-(2,2,2-trifluoro ethoxycarbonyl) tetracyclo[4.4.0.1$^{2,5}$.1$^{7,10}$]dodeca-3-en, and 8-methyl-8-(2,2,2-trifluoro ethoxycarbonyl) tetracyclo[4.4.0.1$^{2,5}$.1$^{7,10}$]dodeca-3-en; cyclic olefins having N-substitute imide groups such as N-phenyl-(5-norbornene-2,3-dicarboxyimide); cyclic olefins having cyano groups such as 8-cyanotetracyclo[4.4.0.1$^{2,5}$.1$^{7,10}$]dodeca-3-en, 8-methyl-8-cyanotetracyclo[4.4.0.1$^{2,5}$.1$^{7,10}$]dodeca-3-en, and 5-cyanobicyclo[2.2.1]hept-2-en; and cyclic olefins having halogen atoms such as 8-chlorotetracyclo[4.4.0.1$^{2,5}$.1$^{7,10}$]dodeca-3-en and 8-methyl-8-chlorotetracyclo[4.4.0.1$^{2,5}$.1$^{7,10}$]dodeca-3-en. These monomers may be used singly, or two or more thereof may be used in combination.

Specific examples of the cyclic olefin monomers having no polar groups include bicyclo[2.2.1]hept-2-ene, 5-ethyl-bicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[4.3.0.1$^{2,5}$]deca-3,7-diene, tetracyclo[8.4.0.1$^{11,14}$.0$^{3,7}$]pentadeca-3,5,7,12,11-pentaene, tetracyclo[4.4.0.1$^{2,5}$.1$^{7,10}$]deca-3-ene, 8-methyl-tetracyclo[4.4.0.1$^{2,5}$.1$^{7,10}$]dodeca-3-ene, 8-ethyl-tetracyclo[4.4.0.1$^{2,5}$.1$^{7,10}$]dodeca-3-ene, 8-methylidene-tetracyclo[4.4.0.1$^{2,5}$.1$^{7,10}$]dodeca-3-ene, 8-ethylidene-tetracyclo[4.4.0.1$^{2,5}$.1$^{7,10}$]dodeca-3-ene, 8-vinyl-tetracyclo[4.4.0.1$^{2,5}$.1$^{7,10}$]dodeca-3-ene, 8-propenyl-tetracyclo[4.4.0.1$^{2,5}$.1$^{7,10}$]dodeca-3-ene, pentacyclo[6.5.1.1$^{3,6}$.0$^{2,7}$.0$^{9,13}$]pentadeca-3,10-diene, cyclopentene, cyclopentadiene, 1,4-methano-1,4,4a, 5,10,10a-hexahydroanthracene, 8-phenyl-tetracyclo[4.4.0.1$^{2,5}$.1$^{7,10}$]dodeca-3-ene, tetracyclo[9.2.1.0$^{2,10}$.0$^{3,8}$]tetradeca-3,5,7,12-tetraene, pentacyclo[7.4.0.1$^{3,6}$.1$^{10,13}$0$^{2,7}$] entadeca-4,11-diene, and pentacyclo[9.2.1.1$^{4,7}$.0$^{2,10}$.0$^{3,8}$]pentadeca-5,12-diene. These monomers may be used singly, or two or more thereof may be used in combination.

Specific examples of non-cyclic-olefin monomers include α-olefins having 2 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene; and linear olefins such as 1,4-hexadiene, 4-methyl-1,4-hexadiene, 5-methyl-1,4-hexadiene, 1,7-octadiene, and other nonconjugated dienes. These monomers may be used singly, or two or more thereof may be used in combination.

Generally known methods can be used for the polymerization of cyclic olefin polymers from the monomers listed above. They include, for example, ring opening polymerization and addition polymerization.

Preferred polymerization catalysts for these methods include, for example, metal complexes of molybdenum, ruthenium, and osmium. These polymerization catalysts may be used singly or as a combination of two or more thereof.

For the cyclic olefin polymer produced through polymerization of the various monomers, hydrogenation is performed normally using a hydrogenation catalyst. The hydrogenation step may be performed by, for example, using a catalyst generally adopted for hydrogenation of olefin compounds. Specifically, useful ones include Ziegler type homogeneous catalysts, noble metal complex catalysts, and supported type noble metal based catalysts.

Of these hydrogenation catalysts, noble metal complex catalysts such as rhodium and ruthenium are preferable because they will not cause side reactions such as modification of functional groups and the unsaturated carbon-carbon bonds in the polymer will be hydrogenated selectively. Particularly preferable are highly electron donative, nitrogen-containing heterocyclic carbene compounds and ruthenium catalysts having a coordinated phosphine.

Described next are cardo resins to be used as the alkali-soluble resin (a) for the present invention. A cardo resin is a resin having a cardo structure, i.e., a skeleton structure in which two cyclic structures are bonded to a quaternary carbon atom that is a constituent atom of another cyclic structure. A typical cardo structure is one that contains benzene rings bonded to a fluorene ring.

Specific example of such a skeleton structure in which two cyclic structures are bonded to a quaternary carbon atom that is a constituent atom of another cyclic structure include fluorene backbone, bisphenol fluorene backbone, bisaminophenyl fluorene backbone, fluorene backbone having an epoxy group, and fluorene backbone having an acrylic group.

A cardo resin is formed through a polymerization process in which backbone units each having this cardo structure are connected by a reaction between the functional groups bonded to them. A cardo resin has a structure (cardo structure) in which the backbone chain and each bulky side chain are bonded to each other through one atom and the cyclic structures are in a nearly perpendicular direction to the backbone chain.

Specific examples of such a monomer having a cardo structure include bisphenols containing a cardo structure such as bis(glycidyl oxyphenyl) fluorene type epoxy resin, 9,9-bis(4-hydroxyphenyl) fluorene, and 9,9-bis(4-hydroxy-3-methyl phenyl) fluorene; 9,9-bis(cyanoalkyl) fluorenes such as 9,9-bis(cyanomethyl) fluorene; and 9,9-bis(aminoalkyl) fluorenes such as 9,9-bis(3-aminopropyl) fluorene.

A cardo resin is a polymer produced through polymerization of a monomer having a cardo structure, but it may be a copolymer with another copolymerizable monomer.

Generally known methods can be used for polymerization of the above monomers, and they include, for example, ring opening polymerization and addition polymerization.

There are no specific limitations on the reaction solvent to be used for synthesing an alkali-soluble resin (a) that is preferred for the present invention, and examples thereof include polar aprotic solvents such as N-methyl-2-pyrolidone, γ-butyrolactone, N,N-dimethyl formamide, N,N-dimethyl acetamide, and dimethyl sulfoxide; glycol ethers such as tetrahydrofuran, dioxane, propylene glycol monomethyl ether, propylene glycol monoethyl ether, diethylene glycol dimethyl ether, diethylene glycol diethyl ether, and diethylene glycol ethyl methyl ether; ketones such as acetone, methyl ethyl ketone, diisobutyl ketone, and diacetone alcohol; esters such as ethyl acetate, butyl acetate, isobutyl acetate, propyl acetate, propylene glycol monomethyl ether acetate, glycol ether acetate, and 3-methyl-3-methoxy butyl acetate; alcohols such as ethyl lactate, methyl lactate, diacetone alcohol, and 3-methyl-3-methoxy butanol; and aromatic hydrocarbons such as toluene and xylene. Two or more of these reaction solvents may be contained. These solvents preferably account for 100 to 2,000 parts by mass relative to the total weight, which accounts for 100 parts by mass, of the compound having an amino group and the compound having an anhydride group. Their quantity in this range ensures stable progress of the polymerization reaction.

The photosensitive colored resin composition according to the present invention contains a photosensitive compound (b).

The photosensitive compound is one in which the chemical structure changes in response to ultraviolet ray, and examples thereof include photoacid generating agent, photobase generating agent, and photopolymerization initiator. Of these, a photoacid generating agent works to produce an acid in the irradiated portion so that the irradiated part increases in solubility in aqueous alkali solutions, allowing a positive type pattern to be formed after dissolution of the irradiated portion. A photobase generating agent works to produce a base in the irradiated portion so that the irradiated part decreases in solubility in aqueous alkali solutions, allowing a negative type pattern to be formed by making the irradiated portion insoluble. A photopolymerization initiator works to generate radicals in the light irradiated part. If the photosensitive colored resin composition contains a radical polymerizable compound (f) as described later, radical polymerization progresses and the exposed part of the resin composition film is insolubilized to the alkali developer, allowing a negative pattern to be formed. Furthermore, UV curing during light exposure is promoted to improve the sensitivity.

Of the above photosensitive compounds (b), the use of a photoacid generating agent is preferable because it serves to produce a high-resolution pattern with high sensitivity. Examples of such a photoacid generating agent include quinone diazide compounds, sulfonium salts, phosphonium salts, diazonium salts, and iodonium salts. Here, a broadband light source that covers the wavelength region of 350 nm to 450 nm, preferably containing the g-line (436 nm), h-line (405 nm), and i-line (365 nm) in particular, is mainly used for exposure. Some broadband light sources may cover other wavelength regions.

A photosensitive compound (b) used for the present invention contains, as an essential component, a compound (b1) characterized by the fact that its maximum absorption wavelength in the range of 350 nm or more and 450 nm or less is located within the wavelength range of 350 nm or more and 390 nm or less.

Here, the maximum absorption wavelength in the range of 350 nm or more and 450 nm or less means the largest value of absorption wavelength that is seen when observation is focused only on the wavelength range of 350 nm or more 450 nm or less. Thus, although the photosensitive compound (b1) may show a larger absorption wavelength outside this range, the invention focuses on the maximum value of absorption wavelength in the range of 350 nm or more and 450 nm or less. The expression "the maximum absorption wavelength in the range of 350 nm or more and 450 nm or less is located within the wavelength range of 350 nm or more and 390 nm or less" means that the largest value of absorption wavelength in the range of 350 nm or more and 450 nm or less is contained in the wavelength range of 350 nm or more and 390 nm or less.

With the aim of ensuring an improved throughput in a production process, the use of a high-sensitivity photosensitive resin composition has been required when adopting a broadband light source generally used for exposure. To prevent troubles from being caused by light entering the apparatus, the present invention uses a compound (c) having an absorption maximum in the range of 400 nm or more and less than 490 nm as described later. The inclusion of such a compound (c) serves to depress the generation of troubles, such as degradation, malfunction, and electric current leakage, attributable to light entering the apparatus. When such a compound as the compound (c) is contained, however, there tends to occur the disadvantage that high sensitivity cannot be realized during exposure as a result of the above-mentioned compound efficiently absorbing light particularly at wavelengths of 390 nm to 450 nm in the exposure wavelength range of 350 nm to 450 nm. With the aim of solving the problem, the present inventors focused on the fact that the absorption by a compound (c) at wavelengths of 350 nm to 390 nm is relatively small compared to that in the exposure wavelength range of 350 nm to 450 nm and arrived at the idea of adding, as the photosensitive compound (b), a photosensitive compound (b1) that is characterized by the fact that its maximum absorption wavelength in the range of 350 nm or more and 450 nm or less is located within the wavelength range of 350 nm or more and 390 nm or less. As a result, it was found that although a compound (c) is present, the addition of a photosensitive compound (b1) that reacts efficiently to light to meet simultaneously the two objectives of achieving a high sensitivity exposure in the broadband range that is used commonly and preventing troubles from occurring due to light entering the apparatus, which represent two major problems that have conventionally been difficult to solve simultaneously.

For the photosensitive compound (b1), specific examples of photoacid generating agents include 4-naphthoquinone diazide sulfonyl ester compounds, sulfonium salts, phosphonium salts, and diazonium salts.

A preferable example of a 4-naphthoquinone diazide sulfonyl ester compound is one in which a compound having a phenolic hydroxyl group and a 4-naphthoquinone diazide sulfonic acid are introduced through an ester bond, though there are other useful compounds. It is also possible to use a naphthoquinone diazide sulfonyl ester compound that contains a 4-naphthoquinone diazide sulfonyl group and another functional group, such as 5-naphthoquinone diazide sulfonyl group, coexisting in one molecule.

Compounds having a phenolic hydroxyl group that are useful here include Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (trade names, all manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (trade names, all manufactured by Asahi Organic Chemicals Industry Co., Ltd.), and 2,6-dimethoxymethyl-4-tert-butyl phenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylene bisphenol, and BisP-AP (trade names, all manufactured by Honshu Chemical Industry Co., Ltd.).

Of the examples of photoacid generating agents, sulfonium salts, phosphonium salts, and diazonium salts are preferable because they can stabilize moderately the acid component produced by light exposure. Particularly preferable are sulfonium salts, phosphonium salts, and diazonium salts characterized by the fact that its maximum absorption wavelength in the range of 350 nm or more and 450 nm or less is located within the wavelength range of 350 nm or more and 390 nm or less.

The photosensitive compound (b1) preferably accounts for 5 parts by mass or more, more preferably 10 parts by mass or more, relative to the total quantity, which accounts for 100 parts by mass, of the photosensitive compound. The content is preferably 90 parts by mass or less, more preferably 80 parts by mass or less. A content of 5 parts by mass or more ensures high sensitivity to broadband light sources, whereas a content of 90 parts by mass or less ensures a cured film with a decreased water absorption rate.

The photosensitive compound (b) may contain photosensitive compounds other than the photosensitive compound (b1). Specific examples of the photoacid generating agent include 5-naphthoquinone diazide sulfonyl ester compounds, sulfonium salts, phosphonium salts, and diazonium salts. A preferable example of a 5-naphthoquinone diazide sulfonyl ester compound is one in which a compound having a phenolic hydroxyl group and a 5-naphthoquinone diazide sulfonic acid are introduced through an ester bond, though there are other useful compounds.

The above naphthoquinone diazide compounds can be synthesized through esterification reaction of a compound having a phenolic hydroxyl group and a quinone diazide sulfonic acid compound, and generally known methods can serve for the synthesis. The use of these naphthoquinone diazide compounds serve to further improve the resolution, sensitivity, and residual film percentage.

Of the examples of photoacid generating agents, sulfonium salts, phosphonium salts, and diazonium salts are preferable because they can stabilize moderately the acid component produced by light exposure.

When the photosensitive colored resin composition according to the present invention is a positive type one that contains a photoacid generating agent as the photosensitive compound (b), the photosensitive compound (b) used preferably accounts for 0.1 part by mass or more, more preferably 1 part by mass or more, and still more preferably 3 parts by mass or more, and preferably 100 parts by mass or less, more preferably 80 parts by mass or less, and still more preferably 50 parts by mass or less, relative to 100 parts by mass of the alkali-soluble resin (a). A content of 0.1 part by mass or more serves to enable pattern formation while a content of 100 parts by mass or less serves to decrease the outgassing from the photosensitive compound (b).

For the present invention, furthermore, a photobase generating agent may be added as photosensitive compound (b1). Specific examples thereof include amide compounds and ammonium salts.

Such amide compounds include, for example, 2-nitrophenylmethyl-4-methacryloxy piperidine-1-carboxylate, 9-anthrylmethyl-N,N-dimethyl carbamate, 1-(anthraquinone-2-yl) ethylimidazole carboxylate, and (E)-1-[3-(2-hydroxyphenyl)-2-propenoyl] piperidine.

Such ammonium salts include, for example, 1,2-diisopropyl-3-(bisdimethylamino) methylene) guanidium 2-(3-benzoylphenyl) propionate, (Z)-{[bis(dimethylamino) methylidene] amino}-N-cyclohexylamino) methaniumtetrakis(3-fluorophenyl) borate, 1,2-dicyclohexyl-4,4,5,5-tetramethylbiguanidium n-butyltriphenyl borate.

When the photosensitive colored resin composition according to the present invention is a negative type photosensitive resin composition that contains a photobase generating agent as the photosensitive compound (b), the photosensitive compound (b) present in the photosensitive colored resin composition preferably accounts for 0.1 part by mass or more, more preferably 0.5 part by mass or more, still more preferably 0.7 part by mass or more, and particularly preferably 1 part by mass or more, relative to 100 parts by mass of the alkali-soluble resin (a). A content in the above range ensures improved sensitivity during exposure. Furthermore, the content is preferably 25 parts by mass or less, more preferably 20 parts by mass or less, still more preferably 17 parts by mass or less, and particularly preferably 15 parts by mass or less. A content in the above range ensures an improved resolution after development and the formation of a pattern shape with a small taper.

For the present invention, furthermore, a photopolymerization initiator may be added as a photosensitive compound (b1). Preferable examples thereof include benzyl ketal based photopolymerization initiator, α-hydroxyketone based photopolymerization initiator, α-aminoketone based photopolymerization initiator, acyl phosphine oxide based photopolymerization initiator, oxime ester based photopolymerization initiator, acridine based photopolymerization initiator, benzophenone based photopolymerization initiator, acetophenone based photopolymerization initiator, aromatic keto ester based photopolymerization initiator, and benzoic acid ester based photopolymerization initiator, of which α-hydroxyketone based photopolymerization initiator, α-aminoketone based photopolymerization initiator, acyl phosphine oxide based photopolymerization initiator, oxime ester based photopolymerization initiator, acridine based photopolymerization initiator, and benzophenone based photopolymerization initiator are more preferable from the viewpoint of improved sensitivity during exposure, and among others, α-aminoketone based photopolymerization initiator, acyl phosphine oxide based photopolymerization initiator, and oxime ester based photopolymerization initiator are still more preferable.

Examples of the benzyl ketal based photopolymerization initiator include, for example, 2,2-dimethoxy-1,2-diphenyl ethane-1-one.

Examples of the α-hydroxyketone based photopolymerization initiator include, for example, 1-(4-isopropyl phenyl)-2-hydroxy-2-methylpropane-1-one, 2-hydroxy-2-methyl-1-phenylpropane-1-one, 1-hydroxycyclohexylphenyl ketone, 1-[4-(2-hydroxyethoxy) phenyl]-2-hydroxy-2-methylpropane-1-one, and 2-hydroxy-1-[4-[4-(2-hydroxy-2-methylpropionyl) benzyl] phenyl]-2-methylpropane-1-one.

Examples of the α-aminoketone based photopolymerization initiator include, for example, 2-dimethylamino-2-methyl-1-phenylpropane-1-one, 2-diethylamino-2-methyl-1-phenylpropane-1-one, 2-methyl-2-morpholino-1-phenylpropane-1-one, 2-dimethylamino-2-methyl-1-(4-methylphenyl) propane-1-one, 2-dimethylamino-1-(4-ethylphenyl)-2-methylpropane-1-one, 2-dimethylamino-1-(4-isopropylphenyl)-2-methylpropane-1-one, 1-(4-butylphenyl)-2-dimethylamino-2-methylpropane-1-one, 2-dimethylamino-1-(4-methoxyphenyl)-2-methylpropane-1-one, 2-dimethylamino-2-methyl-1-(4-methylthiophenyl) propane-1-one, 2-methyl-1-(4-methylthiophenyl)-2-morpholinopropane-1-one, 2-benzyl-2-dimethylamino-1-(4-morpholinophenyl)-butane-1-one, 2-benzyl-2-dimethylamino-1-(4-dimethylaminophenyl)-butane-1-one, and 2-dimethylamino-2-[(4-methylphenyl) methyl]-1-[4-(4-morpholinyl) phenyl]-1-butanone.

Examples of the acyl phosphine oxide based photopolymerization initiator include, for example, 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl) phosphine oxide.

Examples of the oxime ester based photopolymerization initiator include, for example, 1-phenylpropane-1,2-dione-2-(O-ethoxycarbonyl) oxime, 1-phenylbutane-1,2-dione-2-(O-methoxycarbonyl) oxime, 1,3-diphenylpropane-1,2,3-trione-2-(O-ethoxycarbonyl) oxime, 1-[4-(phenylthio) phenyl] octane-1,2-dione-2-(O-benzoyl) oxime, 1-[4-[4-(carboxyphenyl) thio] phenyl] propane-1,2-dione-2-(O-acetyl) oxime, 1-[9-ethyl-6-(2-methylbenzoyl)-9H-carbazole-3-yl] ethanone-1-(O-acetyl) oxime, 1-[9-ethyl-6-[2-methyl-4-[1-(2,2-dimethyl-1,3-dioxolan-4-yl) methyloxy] benzoyl]-9H-carbazole-3-yl] ethanone-1-(O-acetyl) oxime, and Adeka ARKLS (registered trademark) NCI-831.

Examples of the acridine based photopolymerization initiator include, for example, 1,7-bis(acridine-9-yl)-n-heptane.

Examples of the benzophenone based photopolymerization initiator include, for example, benzophenone, 4,4'-bis(dimethylamino) benzophenone, 4,4'-bis(diethylamino) benzophenone, 4-phenylbenzophenone, 4,4-dichlorobenzophenone, 4-hydroxybenzophenone, alkylated benzophenone, 3,3',4,4'-tetrakis (t-butylperoxycarbonyl) benzophenone, 4-methylbenzophenone, dibenzylketone, and fluorenone.

Examples of the acetophenone based photopolymerization initiator include, for example, 2,2-diethoxyacetophenone, 2,3-diethoxyacetophenone, 4-t-butyldichloroacetophenone, benzalacetophenone, and 4-azidebenzalacetophenone.

Examples of the aromatic keto ester based photopolymerization initiator include, for example, 2-phenyl-2-oxymethyl acetate.

Examples of the benzoic acid ester based photopolymerization initiator include, for example, ethyl 4-(dimethylamino)benzoate, (2-ethyl)hexyl 4-(dimethylamino)benzoate, ethyl 4-(diethylamino)benzoate, and methyl 2-benzoyl benzoate.

A photopolymerization initiator other than the photopolymerization initiator (b1) may be contained in the photosensitive compound (b). Examples thereof include titanocene based photopolymerization initiator.

Examples of the titanocene based photopolymerization initiator include, for example, bis($\eta^5$-2,4-cyclopentadiene-1-yl)-bis[2,6-difluoro)-3-(1H-pyrrole-1-yl)phenyl] titanium (IV) and bis($\eta^5$-3-methyl-2,4-cyclopentadiene-1-yl)-bis(2,6-difluorophenyl) titanium (IV).

When the photosensitive colored resin composition according to the present invention is a negative type photosensitive resin composition that contains a photopolymerization initiator as the photosensitive compound (b), the photosensitive compound (b) present in the photosensitive colored resin composition preferably accounts for 0.1 part by mass or more, more preferably 0.5 part by mass or more, still more preferably 0.7 part by mass or more, and particularly preferably 1 part by mass or more, relative to 100 parts by mass of the alkali-soluble resin (a). A content in the above range ensures improved sensitivity during exposure. Furthermore, the content is preferably 25 parts by mass or less, more preferably 20 parts by mass or less, still more preferably 17 parts by mass or less, and particularly preferably 15 parts by mass or less. A content in the above range ensures an improved resolution after development and the formation of a pattern shape with a small taper.

The photosensitive colored resin composition according to the present invention contains a compound (c) having an absorption maximum in the wavelength range of 400 nm or more and less than 490 nm.

It has been reported that light in the ultraviolet range or the shorter visible wavelength range, particularly in the range of 450 nm or less, entering a device-driving TFT can cause degradation, malfunction, or electric current leakage in the TFT. Thus, these troubles in TFT's can be reduced by applying a heat resistant colored resin film containing a compound (c) according to the present invention to the insulation layers and planarizing films used in organic EL displays.

The compound (c) used in the photosensitive colored resin composition according to the present invention is preferably permeable to light particularly in the 350 nm to 390 nm region of the 350 nm to 450 nm wavelength range. Specifically, the transmittance of light in the wavelength range of 350 nm to 390 nm through a solution of the compound (c) in a solvent with a concentration of $10^{-5}$ mol/L is preferably 40% or more, more preferably 70% or more. This enables the formation of a high-sensitivity, photosensitive colored resin composition.

The compound (c) may be a thermo-coloring compound, dye, or pigment. It is preferable to use one or more of useful dyes and organic pigments.

It is sufficient for the compound (c) to contain at least one of them, which may be realized by, for example, adding one thermo-coloring compound, one dye, or one organic pigment, adding a combination of two or more of thermo-coloring compounds, dyes, and organic pigments, or adding a combination of one or more thermo-coloring compounds, one or more dyes, and one or more organic pigments.

Any thermo-coloring compound to be used as the compound (c) for present invention preferably works for coloration at temperatures of 120° C. or more, more preferably 150° C. or more. As the thermo-coloring compound increases in coloration temperature, the heat resistance under high temperature conditions increases and the light resistance also increases to prevent color degradation during prolonged exposure to light in the ultraviolet and visible ranges.

From the viewpoint of storage stability and color degradation during curing and light irradiation, the dye to be used as the compound (c) for the present invention is preferably a highly heat and light resistant one that is soluble in the organic solvent used to dissolve the alkali-soluble resin (a) or one that is compatible with the resin. Such organic solvents as mentioned above include, for example, polar aprotic solvents such as N-methyl-2-pyrolidone, γ-butyrolactone, γ-valerolactone, δ-valerolactone, N,N-dimethyl formamide, N,N-dimethyl acetamide, dimethyl sulfoxide, 1,3-dimethyl-2-imidazolidinone, N,N'-dimethyl propyleneurea, N,N-dimethyl isobutyric acid amide, and methoxy-N,N-dimethyl propionamide; ethers such as tetrahydrofuran, dioxane, propylene glycol monomethyl ether, and propylene glycol monoethyl ether; ketones such as acetone, methyl ethyl ketone, and diisobutyl ketone; esters such as ethyl acetate, butyl acetate, isobutyl acetate, propyl acetate, propylene glycol monomethyl ether acetate, and 3-methyl-3-methoxy butyl acetate; alcohols such as ethyl lactate, methyl lactate, diacetone alcohol, and 3-methyl-3-methoxy butanol; and aromatic hydrocarbons such as toluene and xylene. Examples of the compound (c), which has an absorption maximum in the wavelength range of 400 nm or more and less than 490 nm, include yellow dyes and orange dyes. By dye type, they include, for example, oil-soluble dyes, disperse dyes, reactive dyes, acidic dyes, and direct dyes.

By the type of backbone structure, they include, but not limited to, anthraquinone based, azo based, phthalocyanine based, methine based, oxazine based, quinoline based, triaryl methane based, and xanthene based dyes. Of these, anthraquinone based, azo based, methine based, triaryl methane based, and xanthene based are preferable from the viewpoint of solubility in organic solvents and heat resistance. These dyes may be used singly or in the form of metal complex dyes. Specific examples thereof include, but not limited to, Sumilan and Lanyl dyes (manufactured by Sumitomo Chemical Co., Ltd.), Orasol, Oracet, Filamid, and Irgasperse dyes (manufactured by Ciba Specialty Chemicals), Zapon, Neozapon, Neptune, and Acidol dyes (manufactured by BASF), Kayaset and Kayakalan dyes (manufactured by Nippon Kayaku Co., Ltd.), Valifast Colors dye (manufactured by Orient Chemical Industries Co., Ltd.), Savinyl, Sandoplast, Polysynthren, and Lanasyn dyes (manufactured by Clariant Japan K.K.), Aizen Spilon dye (manufactured by Hodogaya Chemical Co., Ltd.), functional coloring matter (manufactured by Yamada Kagaku Co., Ltd.), and Plast Color dye and Oil Color dye (manufactured by Arimoto Chemical Co., Ltd.). They may be used singly or as a mixture thereof.

When a pigment is to be used as the compound (c) in the photosensitive colored resin composition according to the present invention, the pigment to be used is preferably a highly heat and light resistant one from the viewpoint of color degradation during curing and light irradiation.

When an organic pigment is to be used as the compound (c) in the photosensitive colored resin composition according to the present invention, specific examples are listed below with color index (CI) numbers. Examples of useful yellow pigments include Pigment Yellow 83, 117, 129, 138, 139, 150, and 180. Examples of useful orange pigments include Pigment Orange 38, 43, 64, 71, and 72. Pigments other than these may also be used.

When an organic pigment is to be used as the compound (c) in the photosensitive colored resin composition according to the present invention, the organic pigment to be used may have undergone surface treatment such as rosin treatment, acidic group treatment, and basic group treatment, as required. In addition, a dispersing agent may be used in combination as required. Useful dispersing agents include, for example, cation based, anion based, nonionic, amphoteric, silicone based, and fluorine based surface active agents.

The compound (c) used for the present invention preferably accounts for 0.1 to 300 parts by mass, particularly preferably 0.2 to 200 parts by mass, relative to 100 parts by mass of the alkali-soluble resin (a). When the compound (c) accounts for 0.1 part by mass or more, it will be possible to absorb light in the applicable wavelength range. If its content is 300 parts by mass or less, it will be possible to absorb light in the applicable wavelength range while maintaining a required contact strength between the photosensitive colored resin film and the substrate and allowing a film with required heat resistance and mechanical characteristics to be obtained after heat treatment.

The photosensitive colored resin composition according to the present invention preferably includes a compound (d) having an absorption maximum in the wavelength range of 490 nm or more and less than 580 nm and a compound (e) having an absorption maximum in the wavelength range of 580 nm or more and less than 800 nm.

The outdoor use of an organic EL display may leads to the problem of visibility deterioration caused by external light reflection. Accordingly, it is preferable for the insulation layers and planarizing films used in an organic EL display to be able to absorb light in the visible light region to reduce the visibility deterioration attributed to external light reflection.

Visibility deterioration as described above can be reduced when the photosensitive coloring composition according to the present invention contains such a compound (d) and a compound (e) in addition to the compound (c).

The photosensitive colored resin composition containing a compound (d) and a compound (e) is preferably permeable to light particularly in the 350 nm to 390 nm region of the 350 nm to 450 nm wavelength range. Specifically, the transmittance of light in the wavelength range of 350 nm to 390 nm through a solution of the compound (d) and the compound (e) in a solvent with a concentration of $10^{-5}$ mol/L is preferably 40% or more, more preferably 70% or more. This enables the formation of a high-sensitivity, photosensitive colored resin composition.

When the photosensitive coloring composition according to the present invention contains the compound (d) and the compound (e) in addition to the compound (c), it is preferable for the compound (d) and the compound (e) to contain a thermo-coloring compound, a dye, and a pigment, or at least one of them, more preferably a dye and an organic pigment, or at least one of them. In such cases, it is sufficient for the compound (d) and the compound (e) each to contain at least one of them, which may be realized by, for example, adding one thermo-coloring compound, one dye, or one organic pigment, adding a combination of two or more of thermo-coloring compounds, dyes, and organic pigments, or adding a combination of one or more thermo-coloring compounds, one or more dyes, and one or more organic pigments.

When the photosensitive coloring composition according to the present invention contains the compound (d) and the compound (e) in addition to the compound (c), the thermo-coloring compound used as the compound (d) or the compound (e) preferably has a coloration temperature of 120° C. or more, more preferably 150° C. or more. As the thermo-coloring compound increases in coloration temperature, the heat resistance under high temperature conditions increases and the light resistance also increases to prevent color degradation during prolonged exposure to light in the ultraviolet and visible ranges.

When the photosensitive coloring composition according to the present invention contains the compound (d) and the compound (e) in addition to the compound (c), the dye to be used as the compound (d) and the compound (e) is preferably a highly heat and light resistant one that is soluble in the organic solvent used to dissolve the alkali-soluble resin (a) or one that is compatible with the resin, from the viewpoint of storage stability and color degradation during curing and light irradiation. Such organic solvents as mentioned above include, for example, polar aprotic solvents such as N-methyl-2-pyrolidone, γ-butyrolactone, γ-valerolactone, δ-valerolactone, N,N-dimethyl formamide, N,N-dimethyl acetamide, dimethyl sulfoxide, 1,3-dimethyl-2-imidazolidinone, N,N'-dimethyl propyleneurea, N,N-dimethyl isobutyric acid amide, and methoxy-N,N-dimethyl propionamide; ethers such as tetrahydrofuran, dioxane, propylene glycol monomethyl ether, and propylene glycol monoethyl ether; ketones such as acetone, methyl ethyl ketone, and diisobutyl ketone; esters such as ethyl acetate, butyl acetate, isobutyl acetate, propyl acetate, propylene glycol monomethyl ether acetate, and 3-methyl-3-methoxybutyl acetate; alcohols such as ethyl lactate, methyl lactate, diacetone alcohol, and 3-methyl-3-methoxybutanol; and aromatic hydrocarbons such as toluene and xylene.

Examples of the compound (d), which has an absorption maximum in the wavelength range of 490 nm or more and less than 580 nm, include red dyes and violet dyes.

Examples of the compound (e), which has an absorption maximum in the wavelength range of 580 nm or more and less than 800 nm, include blue dyes and green dyes.

Preferable dyes include, for example, oil-soluble dyes, disperse dyes, reactive dyes, acidic dyes, and direct dyes.

By the type of backbone structure, preferable dyes include, but not limited to, anthraquinone based, azo based, phthalocyanine based, methine based, oxazine based, quinoline based, triaryl methane based, and xanthene based dyes. Anthraquinone based, azo based, methine based, triaryl methane based, and xanthene based are preferable from the viewpoint of solubility in organic solvents and heat resistance. These dyes may be used singly or in the form of metal complex dyes. Specific examples thereof include, but not limited to, Sumilan and Lanyl dyes (manufactured by Sumitomo Chemical Co., Ltd.), Orasol, Oracet, Filamid, and Irgasperse dyes (manufactured by Ciba Specialty Chemicals), Zapon, Neozapon, Neptune, and Acidol dyes (manufactured by BASF), Kayaset and Kayakalan dyes (manufactured by Nippon Kayaku Co., Ltd.), Valifast Colors dye (manufactured by Orient Chemical Industries Co., Ltd.), Savinyl, Sandoplast, Polysynthren, and Lanasyn dyes (manufactured by Clariant Japan K.K.), Aizen Spilon dye (manufactured by Hodogaya Chemical Co., Ltd.), functional coloring matter (manufactured by Yamada Kagaku Co., Ltd.), and Plast Color dye and Oil Color dye (manufactured by Arimoto Chemical Co., Ltd.). They may be used singly or as a mixture thereof.

When the photosensitive coloring composition according to the present invention contains the compound (d) and the compound (e) in addition to the compound (c) and both of them are pigments, it is preferable for the pigments used as the compound (d) and the compound (e) to be highly heat and light resistant from the viewpoint of color degradation during curing and during light irradiation.

Specific examples of organic pigments to be used in such cases are listed below with color index (CI) numbers. Examples of useful red pigments include Pigment Red 48:1, 122, 168, 177, 202, 206, 207, 209, 224, 242, and 254. Examples of useful violet pigments include Pigment Violet 19, 23, 29, 32, 33, 36, 37, and 38. Examples of useful blue pigments include Pigment Blue 15 (15:3, 15:4, 15:6, etc.), 21, 22, 60, and 64. Examples of useful green pigments include Pigment Green 7, 10, 36, 47, and 58. Pigments other than these may also be used.

In such cases, the organic pigment to be used as the compound (d) or the compound (e) may have undergone surface treatment such as rosin treatment, acidic group treatment, and basic group treatment, as required. In addition, a dispersing agent may be used in combination as required. Useful dispersing agents include, for example, cation based, anion based, nonionic, amphoteric, silicone based, and fluorine based surface active agents.

When the photosensitive coloring composition according to the present invention contains the compound (d) and the compound (e) in addition to the compound (c), the compound (d) and the compound (e) each preferably account for 0.1 to 300 parts by mass, more preferably 0.2 to 200 parts by mass, relative to 100 parts by mass of the alkali-soluble resin (a). When the compound (d) and the compound (e) each account for 0.1 part by mass or more, it will be possible to absorb light in the applicable wavelength range. If their contents are 300 parts by mass or less, it will be possible to absorb light in the applicable wavelength range while maintaining a required contact strength between the photosensitive colored resin film and the substrate and allowing a film with required heat resistance and mechanical characteristics to be obtained after heat treatment.

If the photosensitive colored resin composition according to the present invention contains a photopolymerization initiator as the photosensitive compound (b1), it is preferable to further contain a radical polymerizable compound (f).

The radical polymerizable compound (f) is a compound that has an ethylenically unsaturated double bond group in its molecule. If a photopolymerization initiator is contained as the photosensitive compound (b1), radical polymerization of the radical polymerizable compound (f) is promoted during exposure by radicals generated from the photopolymerization initiator used as the photosensitive compound (b1) so that the exposed part of the resin composition film becomes insoluble to the alkali developer, leading to the formation of a negative pattern.

The inclusion of the radical polymerizable compound (f) serves to accelerate the UV curing during exposure to ensure improved sensitivity during exposure. In addition, the crosslink density after the heat curing step will increase, leading to a cured film with an increased hardness.

The radical polymerizable compound (f) is preferably a compound having methacryl group and/or acrylic groups (hereinafter, these are occasionally referred to collectively as (meth)acrylic groups. The name of a compound is also occasionally abbreviated similarly.) that can undergo rapid radical polymerization. It is more preferable for the compound to have two or more (meth)acrylic groups in its molecule from the viewpoint of improved sensitivity during exposure and formation of a cured film with increased hardness. The radical polymerizable compound (f) preferably has a double bond equivalent of 80 to 400 g/mol from the viewpoint of improved sensitivity during exposure and formation of a cured film with increased hardness.

Examples of the radical polymerizable compound (f) include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol tricyclodecane di(meth)acrylate, ethoxylated glycerin tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloxy-2-hydroxypropoxy) phenyl] propane, 1,3,5-tris-((meth)acryloxyethyl) isocyanuric acid, 1,3-bis((meth)acryloxyethyl) isocyanuric acid, 9,9-bis[4-(2-(meth)acryloxyethoxy) phenyl] fluorene, 9,9-bis[4-(3-(meth)acryloxy propoxy) phenyl] fluorene, and 9,9-bis(4-(meth)acryloxy phenyl) fluorene, as well as acid modified forms thereof, ethylene oxide modified forms thereof, and propylene oxide modified forms thereof. From the viewpoint of improved sensitivity during exposure and formation of a cured film with increased hardness, preferable are trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxypropoxy) phenyl] propane, 1,3,5-tris-((meth)acryloxyethyl) isocyanuric acid, 1,3-bis((meth)acryloxyethyl) isocyanuric acid, 9,9-bis[4-(2-(meth)acryloxyethoxy) phenyl] fluorene, 9,9-bis[4-(3-(meth)acryloxy propoxy) phenyl] fluorene, and 9,9-bis(4-(meth)acryloxyphenyl) fluorene, as well as acid modified forms thereof, ethylene oxide modified forms thereof, and propylene oxide modified forms thereof, of which acid modified forms thereof and ethylene oxide modified forms thereof are more preferable from the viewpoint of improved resolution after development. From the viewpoint of improved resolution after development, furthermore, also preferable are compounds that are produced by subjecting a compound having two or more glycidoxy groups in its molecule and an unsaturated carboxylic acid having an ethylenically unsaturated double bond group to ring opening addition reaction and then reacting the resulting compound with a polybasic carboxylic acid or a polybasic carboxylic anhydride.

The radical polymerizable compound (f) used for the present invention preferably accounts for 15 parts by mass or more, more preferably 20 parts by mass or more, still more preferably 25 parts by mass or more, and particularly preferably 30 parts by mass or more, relative to 100 parts by mass of the alkali-soluble resin (a). A content in the above range ensures an improved sensitivity during exposure and the formation of a pattern shape with a small taper. Furthermore, the content is preferably 65 parts by mass or less, more preferably 60 parts by mass or less, still more preferably 55 parts by mass or less, and particularly preferably 50 parts by mass or less. A content in the above range ensures the formation of a cured film with increased heat resistance and the formation of a pattern shape with a low taper.

The photosensitive colored resin composition according to the present invention may contain a heat crosslinking agent. A heat crosslinking agent is a compound having at least two heat reactive functional groups, such as alkoxy methyl group, methylol group, epoxy group, and oxetanyl group, in its molecule. A heat crosslinking agent can form crosslinks between molecules of the alkali-soluble resin (a) or other additional components, thereby serving to produce a heat-cured film with increased heat resistance, chemical resistance, and hardness. Listed below are specific examples of such heat crosslinking agents, which can be used as a combination of two or more thereof.

Preferable examples of compounds having at least two of alkoxy methyl groups and/or methylol groups that can be used in such cases include, for example, DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (trade names, all manufactured by Honshu Chemical Industry Co., Ltd.); and NIKALAC (registered trademark) MX-290, NIKALAC MX-280, NIKALAC MX-270, NIKALAC MX-279, NIKALAC MW-100LM, and NIKALAC MX-750LM (trade names, all manufactured by Sanwa Chemical Co., Ltd.).

Preferable examples of compounds having at least two epoxy groups include Epolight 40E, Epolight 100E, Epolight 200E, Epolight 400E, Epolight 70P, Epolight 200P, Epolight 400P, Epolight 1500NP, Epolight 80MF, Epolight 4000, and Epolight 3002 (all manufactured by Kyoeisha Chemical Co., Ltd.); Denacol EX-212L, Denacol EX-214L, Denacol EX-216L, and Denacol EX-850L (all manufactured by Nagase ChemteX Corporation); GAN and GOT (both manufactured by Nippon Kayaku Co., Ltd.); Epikote 828, Epikote 1002, Epikote 1750, Epikote 1007, YX8100-BH30, E1256, E4250, and E4275 (all manufactured by Japan Epoxy Resins Co., Ltd.); Epicron EXA-9583 and HP4032 (both manufactured by Dainippon Ink and Chemicals Inc.); VG3101 (manufactured by Mitsui Chemicals, Inc.); Tepic S, Tepic G, and Tepic P (all manufactured by Nissan Chemical Industries, Ltd.); Denacol EX-321L (manufactured by Nagase ChemteX Corporation); NC6000 (manufactured by Nippon Kayaku Co., Ltd.); Epotohto YH-434L (manufactured by Tohto Kasei Co., Ltd.); EPPN502H, NC3000 (manufactured by Nippon Kayaku Co., Ltd.); and Epicron N695 and HP7200 (both manufactured by Dainippon Ink and Chemicals Inc.).

Preferable examples of compounds having at least two oxetanyl groups include Eternacoll EHO, Eternacoll OXBP, Eternacoll OXTP, and Eternacoll OXMA (all manufactured by Ube Industries, Ltd.), and oxetanized phenol novolac.

When adding a heat crosslinking agent to the photosensitive colored resin composition according to the present invention, the heat crosslinking agent preferably accounts for 0.1 part by mass or more and 30 parts by mass or less relative to 100 parts by mass of the alkali-soluble resin (a). A heat crosslinking agent content of 0.1 part by mass or more and 30 parts by mass or less ensures the formation of a calcined or cured film with increased chemical resistance and hardness and also allows the photosensitive colored resin composition to have high storage stability.

The photosensitive colored resin composition according to the present invention may contain a compound having a phenolic hydroxyl group as required to help the alkaline developer in developing the photosensitive colored resin composition. Examples of the compound with a phenolic hydroxyl group include, for instance, Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, BisRS-OCHP, (trade names, all manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A (trade names, all manufactured by Asahi Organic Chemicals Industry Co., Ltd.), 1,4-dihydroxy naphthalene, 1,5-dihydroxy naphthalene, 1,6-dihydroxy naphthalene, 1,7-dihydroxy naphthalene, 2,3-dihydroxy naphthalene, 2,6-dihydroxy naphthalene, 2,7-dihydroxy naphthalene, 2,4-dihydroxy quinoline, 2,6-dihydroxy quinoline, 2,3-dihydroxy quinoxaline, anthracene-1,2,10-triol, anthracene-1,8,9-triol, and 8-quinolinol. If such a compound with a phenolic hydroxyl group is contained, the resulting photosensitive colored resin composition will not be dissolved significantly in an alkaline developer before exposure, but will be easily dissolved in an alkaline developer after exposure, leading to a decreased film loss during development and easy development in a short time. Accordingly, the sensitivity will improve easily, which is preferable.

Such a compound having a phenolic hydroxyl group preferably accounts for 1 part by mass or more and 20 parts by mass or less relative to 100 parts by mass of the alkali-soluble resin (a). A content in the above range allows the photosensitive colored resin composition to have increased alkali developability while maintaining high heat resistance.

The photosensitive colored resin composition according to the present invention may contain a heat acid generating agent as required. A heat acid generating agent generates an acid when heat-treated after development to promote the crosslinking reaction between the alkali-soluble resin (a) and the heat crosslinking agent. In regard to the alkali-soluble resin (a), the agent serves particularly to promote the formation of imide rings and oxazole rings in polyimide precursors or polybenzoxazole precursors. This serves to provide a heat resistant colored resin film with an improved chemical resistance, serving to reduce the film loss. The acid generated by the heat acid generating agent is preferably a strong acid, which is preferably an aryl sulfonic acid such as p-toluene sulfonic acid and benzene sulfonic acid or an alkyl sulfonic acid such as methane sulfonic acid, ethane sulfonic acid, and butane sulfonic acid. For the present invention, the heat acid generating agent is preferably an aliphatic sulfonic acid compound as represented by general formula (5) or (6), and two or more of such compounds may be contained.

[Chemical compound 8]

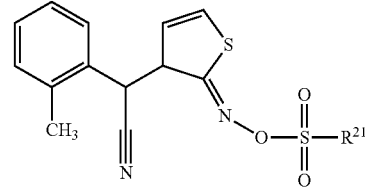

(5)

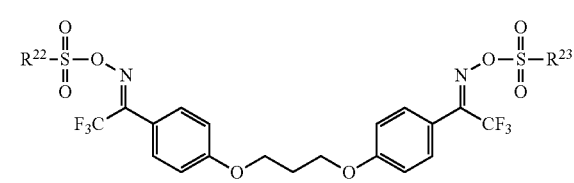

(6)

In the above general formula (5) and (6), $R^{21}$ to $R^{23}$ independently denote an alkyl group having 1 to 10 carbon atoms or a monovalent aromatic group having 7 to 12 carbon atoms. In the alkyl group and aromatic group, some of the hydrogen atoms may be replaced with substituent groups such as alkyl group and carbonyl group.

Specific examples of the compounds represented by general formula (5) are listed below.

[Chemical compound 9]

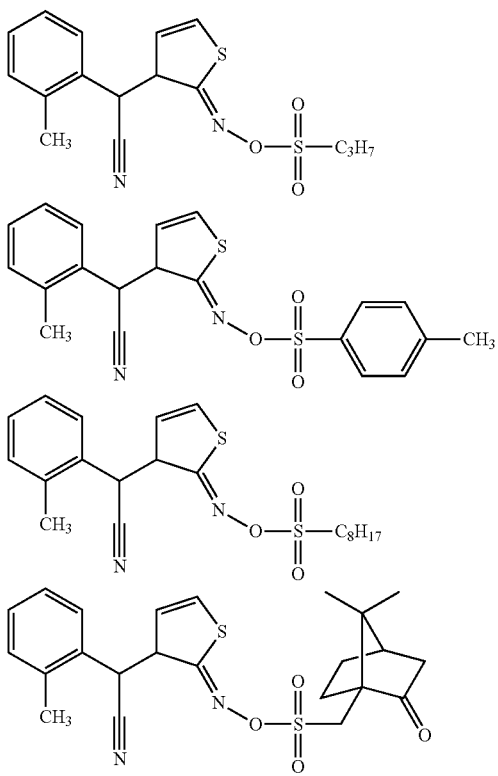

Specific examples of the compounds represented by general formula (6) are listed below.

[Chemical compound 10]

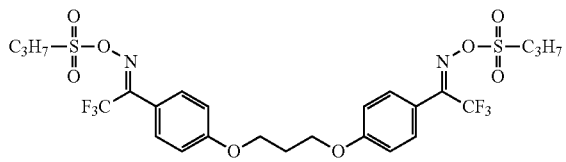

The content of the heat acid generating agent is preferably 0.1 part by mass or more, more preferably 0.3 part by mass or more, and still more preferably 0.5 part by mass or more, relative to 100 parts by mass of the alkali-soluble resin (a) from the viewpoint of promoting the crosslinking reaction. On the other hand, it is preferably 20 parts by mass or less, more preferably 15 parts by mass or less, and still more preferably 10 parts by mass or less, from the viewpoint of allowing the heat resistance colored resin film to maintain required electrical insulating properties.

The photosensitive colored resin composition according to the present invention may contain a contact improving agent as required. Examples of such contact improving agents include silane coupling agents such as vinyl trimethoxysilane, vinyl triethoxysilane, epoxy cyclohexyl ethyl trimethoxysilane, 3-glycidoxy propyl trimethoxysilane, 3-glycidoxy propyl triethoxysilane, p-styryl trimethoxysilane, 3-aminopropyl trimethoxysilane, 3-aminopropyl triethoxysilane, and N-phenyl-3-aminopropyl trimethoxysilane, as well as titanium chelate agents, aluminum chelate agents, and compounds obtainable by reacting an aromatic amine compound and a silicon compound containing an alkoxy group. Two or more thereof may be contained. If these contact improving agents are contained, the photosensitive colored resin film can come in stronger contact with the substrate material such as silicon wafer, ITO, $SiO_2$, and nitride silicon during the development step. They also serve to improve the resistance to oxygen plasma used for cleaning and to UV ozone treatment. The content of the contact improving agent used in such cases is preferably 0.1 to 10 parts by mass relative to 100 parts by mass of the alkali-soluble resin (a). A content in this range serves to ensure strong contact after the development step and provide a photosensitive colored resin composition that is highly resistant to oxygen plasma and UV ozone treatment.

The photosensitive colored resin composition according to the present invention may contain an adhesion improving agent. Examples of the adhesion improving agent include alkoxysilane-containing aromatic amine compounds, aromatic amide compounds, and non-aromatic silane compounds. Two or more thereof may be contained. If these compounds are contained, the calcined or cured film will maintain improved adhesion with the base.

Specific examples of the alkoxysilane-containing aromatic amine compounds and aromatic amide compounds are described below. In addition, they also include compounds obtainable through a reaction between an aromatic amine compound and an alkoxy-containing silicon compound, such as, for instance, compounds obtainable through a reaction between an aromatic amine compound and an alkoxysilane compound having an epoxy group, chloromethyl group, or the like that reacts with the amino group.

[Amendment 03.08.2016 According to Regulation 91]

[Chemical compound 11]

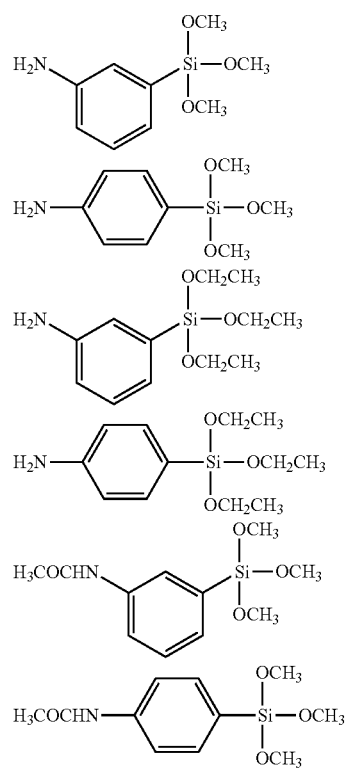

-continued

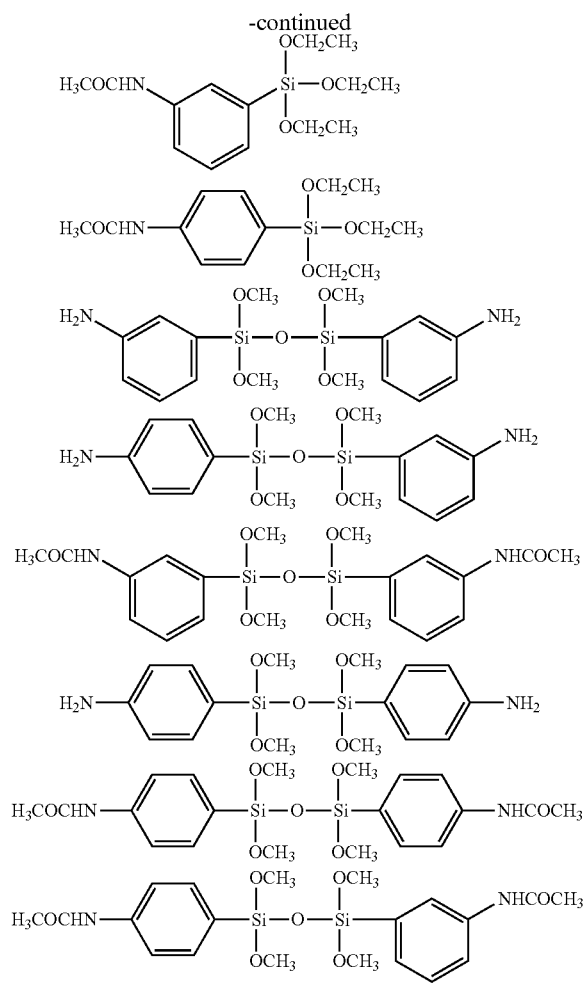

Examples of the non-aromatic silane compounds include vinyl silane compounds such as vinyl trimethoxysilane, vinyl triethoxysilane, vinyl trichlorosilane, and vinyl tris-(β-methoxyethoxy) silane; and silane compounds containing a carbon-carbon unsaturated bond such as 3-methacryloxypropyl trimethoxysilane, 3-acryloxypropyl trimethoxysilane, p-styryl trimethoxysilane, 3-methacryloxypropyl methyldimethoxysilane, and 3-methacryloxypropyl methyldiethoxysilane. In particular, vinyl trimethoxysilane and vinyl triethoxysilane are preferable.

The content of the adhesion improving agent used in such cases is preferably 0.01 to 15 parts by mass relative to 100 parts by mass of the alkali-soluble resin (a). A content in this range ensures that the calcined or cured film will maintain improved adhesion with the base. It may be also effective to use such compounds as vinyl trimethoxysilane and vinyl triethoxysilane that can work as both a contact improving agent and an adhesion improving agent.

The photosensitive colored resin composition according to the present invention may contain a surface active agent, as required, with the aim of improving the wettability with the substrate or improving the uniformity in the thickness of the coating film. The surface active agent to be used may be a commercially available compound, and specific examples thereof include, but not limited to, silicone based surface active agents such as SH series, SD series, and ST series manufactured by Toray Dow Corning Silicone Co., Ltd., BYK series manufactured by BYK Japan KK, KP series manufactured by Shin-Etsu Chemical Co., Ltd., Disfoam series manufactured by NOF Corporation, and TSF series manufactured by Toshiba Silicone Co., Ltd.; fluorochemical surface active agents such as Megafac (registered trademark) series manufactured by Dainippon Ink and Chemicals Inc., Fluorad series manufactured by Sumitomo 3M Limited, Surflon (registered trademark) series and Asahi Guard (registered trademark) series manufactured by Asahi Glass Co., Ltd., EF series manufactured by Shin-Akita Kasei Co., Ltd., and PolyFox series manufactured by OMNOVA Solutions Inc.; and acrylic and/or methacrylic polymer based surface active agents such as Polyflow series manufactured by Kyoeisha Chemical Co., Ltd. and Disparlon (registered trademark) series manufactured by Kusumoto Chemicals Ltd.

When adding a surface active agent to the photosensitive colored resin composition according to the present invention, the surface active agent preferably accounts for 0.001 part by mass or more and 1 part by mass or less relative to 100 parts by mass of the alkali-soluble resin (a). A content in the above range serves to improve the wettability with the substrate and the thickness uniformity of the coating film without suffering from troubles such as bubbles and pinholes.

The photosensitive colored resin composition according to the present invention preferably contains a solvent. Such solvents include, for example, polar aprotic solvents such as N-methyl-2-pyrolidone, γ-butyrolactone, γ-valerolactone, δ-valerolactone, N,N-dimethyl formamide, N,N-dimethyl acetamide, dimethyl sulfoxide, 1,3-dimethyl-2-imidazolidinone, N,N'-dimethyl propyleneurea, N,N-dimethyl isobutyric acid amide, and methoxy-N,N-dimethyl propionamide; ethers such as tetrahydrofuran, dioxane, propylene glycol monomethyl ether, and propylene glycol monoethyl ether; ketones such as acetone, methyl ethyl ketone, and diisobutyl ketone; esters such as ethyl acetate, butyl acetate, isobutyl acetate, propyl acetate, propylene glycol monomethyl ether acetate, and 3-methyl-3-methoxybutyl acetate; alcohols such as ethyl lactate, methyl lactate, diacetone alcohol, and 3-methyl-3-methoxybutanol; and aromatic hydrocarbons such as toluene and xylene. Two or more thereof may be contained. To ensure dissolution of the composition, the solvent used preferably accounts for 100 parts by mass or more relative to 100 parts by mass of the alkali-soluble resin (a). To ensure the formation of a coating film with a film thickness of 1 µm or more, it preferably accounts for 1,500 parts by mass or less.

Described below is the production method for the photosensitive colored resin composition according to the present invention.

A photosensitive colored resin composition is prepared by mixing the components required to constitute the photosensitive colored resin composition according to the present invention, i.e., alkali-soluble resin (a), photosensitive compound (b), and compound (c), and other components as required such as compound (d), compound (e), a heat crosslinking agent, a compound having a phenolic hydroxyl group, a heat acid generating agent, a contact improving agent, an adhesion improving agent, a surface active agent, and a solvent. Any photosensitive colored resin composition to be used for the undermentioned method for producing the photosensitive colored resin composition film according to the present invention preferably contains a solvent to dissolve the components. Available methods for accelerating the dissolution in such cases include heating and stirring. When heating is performed, an appropriate heating temperature is selected preferably in a range, commonly from room temperature to 80° C., where a photosensitive colored resin composition having unimpaired performance is obtained. In the present Description, room temperature means 25° C. There are no specific limitations on the order of dissolving these components, and for example, the compound with the lowest solubility to the solvent may be dissolved first followed by others in the order of solubility. When stirring is performed, an appropriate rotating speed is selected preferably in a range, commonly from 200 rpm to 2,000 rpm, where a photosensitive colored resin composition having unimpaired performance is obtained. Even when stirring is adopted, heating may also be performed, normally at room temperature to 80° C. Or, the dissolution of those components that are likely to form bubbles when dissolved by stirring, such as surface active agents and some contact improving agents, should be performed after the dissolution the other components to prevent insufficient dissolution of the latter due to bubble formation.

It is preferable for the resulting photosensitive colored resin composition to be filtrated through a filter to remove dust and particles. Filters with a pore size of, for instance, 0.5 µm, 0.2 µm, 0.1 µm, 0.05 µm, or 0.02 µm may be useful, though there are no specific limitations on the size. The filter to be used for the filtration may be of such a material as polypropylene (PP), polyethylene (PE), nylon (NY), and polytetrafluoroethylene (PTFE), of which polyethylene and nylon are preferable. When the photosensitive colored resin composition contains organic pigments, it is preferable to use a filter having a pore size larger than the diameters of these particles.

Described next below is a method to produce a heat resistant colored resin film from the photosensitive colored resin composition according to the present invention.

The production method for the photosensitive colored resin composition according to the present invention film includes:

a coating step for coating a substrate with the aforementioned photosensitive colored resin composition to form a coating film, a drying step for drying the coating film to form a photosensitive colored resin film, a light exposure step for exposing the dried photosensitive colored resin film to light, a development step for developing the light-exposed photosensitive colored resin film, and a heat treatment step for heat-treating the developed photosensitive colored resin film, thereby providing a heat resistance colored resin film.

In the coating step, the aforementioned photosensitive colored resin composition is spread over a substrate to form a coating film. Methods available for coating a substrate with the photosensitive colored resin composition include the spin coating method, slit coating method, dip coating method, spray coating method, and printing method. Of these, the use of the slit coating method that adopts a slit nozzle is preferable from the viewpoint of coating of a large-type substrate and improved productivity.

Before coating a base with the photosensitive colored resin composition, the support may be pre-treated with a contact improving agent as described above. For example, a contact improving agent may be dissolved to 0.5 to 20 wt % in a solvent such as isopropanol, ethanol, methanol, water, tetrahydrofuran, propylene glycol monomethyl ether acetate, propylene glycol monomethyl ether, ethyl lactate, and diethyl adipate to prepare a solution, which is then used to treat the support surface by an appropriate technique such as spin coating, slit die coating, bar coating, dip coating, spray coating, and steam processing. Here, it is preferable that to perform vacuum drying, as required, followed by heat treatment at 50° C. to 300° C. to accelerate the reaction between the support and the contact improving agent.

In the drying step, the coating film of the photosensitive colored resin composition is dried to form a film of the photosensitive colored resin. Methods available for drying the coating film of the photosensitive colored resin composition include the use of an oven, hot plate, infrared ray, or the like, and it is preferable to heat it in the range of 50° C. to 150° C. for one minute to several hours. Here, drying as referred to here typically means removal of the solvent from a solvent-containing resin composition, but for a solvent-free resin composition, it means reducing the flowability present in the coating step by, for example, partial cross-linking to form a film fixed on the support.

In a drying step for drying a coating film of a solvent-containing photosensitive colored resin composition, it is preferable to dry the coating film under reduced pressure to form a photosensitive colored resin film.

In the light exposure step, the dried photosensitive colored resin film is exposed to light. Here, in the light exposure step, an actinic ray is applied to the photosensitive colored resin film through a mask having an intended pattern. Actinic rays available for such light exposure include ultraviolet ray, visible light, electron beam, and X-ray. For the present invention, the g-line (436 nm), h-line (405 nm), and i-line (365 nm), which have wavelengths commonly used for exposure may be used, and it is particular preferable to use broadband light that contains the g-line, h-line, and i-line.

In the development step, the light-exposed photosensitive colored resin film is developed.

When a photoacid generating agent is used as the photosensitive compound (b), an acid is formed in the exposed portion so that the exposed portion increases in solubility in aqueous alkali solutions, allowing a positive type pattern to be formed after dissolution of the exposed portion. This means that the exposed portion is removed in the development step for positive pattern formation. Preferable developers include an aqueous solution of alkaline compounds such as tetramethyl ammonium, diethanol amine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethylaminoethanol, dimethylaminoethyl methacrylate, cyclohexyl amine, ethylene diamine, and hexamethylene diamine. In some cases, such an aqueous alkali solution may also contain polar solvents such as N-methyl-2-pyrolidone, N,N-dimethyl formamide, N,N-dimethyl acetamide, dimethyl sulfoxide, γ-butyrolactone, and dimethyl acrylamide; alcohols such as methanol, ethanol and isopropanol; esters such as ethyl lactate and propylene glycol monomethyl ether acetate; and ketones such as cyclopentanone, cyclohexanone, isobutyl ketone, and methyl isobutyl ketone; which may be added singly or as a combination of two or more thereof.

Methods available for the development include, for example, applying an aforementioned developer directly to the light-exposed film, spraying an aforementioned developer in an atomized form, immersing the light-exposed film in an aforementioned developer, and applying supersonic waves to the light-exposed film after immersion in an aforementioned developer. It is preferable for the light-exposed film to be held in contact with a developer for 5 seconds to 10 minutes.

Commonly, rinsing in water is performed after the development step. Here again, the water used for rinsing may contain an alcohol such as ethanol and isopropyl alcohol, and an ester such as ethyl lactate and propylene glycol monomethyl ether acetate.

When a photobase generating agent or a photopolymerization initiator is used as the photosensitive compound (b), the exposed portion decreases in solubility or becomes insoluble in aqueous alkali solutions, allowing a negative type pattern to be formed after dissolution of the non-exposed portion. In this case, alkali developers are generally used for the development step. Preferable alkali developers include, for example, organic alkali solutions and aqueous solutions of compounds that show alkalinity, of which aqueous solutions of compounds that show alkalinity, that is, alkaline aqueous solutions are more preferable from an environmental viewpoint.

Such organic alkali solutions and aqueous solutions of compounds that show alkalinity include, for example, 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethylammonium hydroxide, tetraethylammonium hydroxide, sodium hydroxide, potassium hydroxide, magnesium hydroxide, calcium hydroxide, barium hydroxide, sodium carbonate, and potassium carbonate.

Organic solvents may be used as solvents for the developers. Such organic solvents include, for example, the aforementioned solvents, ethyl acetate, ethyl pyruvate, ethyl 3-methoxypropionate, ethyl 3-ethoxypropionate, N-methyl-2-pyrolidone, dimethyl sulfoxide, and hexamethyl phosphortriamide.

The solvent to be used with a developer may be a mixed solution that contains both an organic solvent as given above and a poor solvent for the negative photosensitive resin composition according to the present invention. Examples of the solvent for the negative photosensitive resin composition according to the present invention include water, methanol, ethanol, isopropyl alcohol, toluene, and xylene.

Methods available for the development include, for example, applying an aforementioned developer directly to the light-exposed film, spraying an aforementioned developer in an atomized form, immersing the light-exposed film in an aforementioned developer, and applying supersonic waves to the light-exposed film after immersion in an aforementioned developer. It is preferable for the light-exposed film to be held in contact with a developer for 5 seconds to 10 minutes.

It is preferable for the relief pattern resulting from the development step to be washed with a rinsing liquid. The rinsing liquid is preferably water when an alkaline aqueous solution is used as developer.

There are various aqueous solutions that are available for use as rinsing liquid. Examples thereof include aqueous solutions of alcohols such as ethanol and isopropyl alcohol, aqueous solutions of esters such as propylene glycol monomethyl ether acetate, and aqueous solutions of compounds that show acidity such as carbon dioxide gas, hydrochloric acid, and acetic acid.

An organic solvent may be used as rinsing liquid. From the viewpoint of the affinity with developers, preferable examples of the organic solvent include methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, and 2-heptanone.

A heat resistant colored resin film can be obtained by heat-treating the photosensitive colored resin film thus prepared. For the present invention, heat treatment means heating at a temperature in the range of 120° C. to 500° C., e.g., heating at 250° C. for 60 minutes.

Heat resistant colored resin films produced from the photosensitive colored resin composition according to the present invention can be used preferably as insulation film or protecting film for wiring. Examples thereof include insulation films and protecting films for wiring on printed boards that include wiring of copper, aluminum, or the like formed on films or substrates of polyimide, ceramics, or the like, and protecting films for partially soldered wiring. If containing an electric conductive filler, the photosensitive colored resin composition can be used also as wiring material.

Cured films produced by curing the photosensitive colored resin composition according to the present invention can be used preferably as planarizing films and insulation layers in display devices that include a TFT-carrying substrate, planarizing film, insulation layer, and display elements formed in this order. Examples of display devices having such a structure include liquid crystal display devices and organic EL display devices.

A preferred embodiment of a cured film produced by curing the photosensitive colored resin composition according to the present invention, used as an insulation layer, is a cured film produced by curing the photosensitive colored resin composition that serves as an insulation layer in a display device that includes a first electrode formed on a substrate, an insulation layer formed to cover the periphery of the first electrode, and a second electrode formed so as to face the first electrode.

Another preferred embodiment in which a cured film produced by curing the photosensitive colored resin composition according to the present invention is used as a planarizing film is a display device including a thin film transistor (TFT) having wiring formed on a substrate, and a planarizing film provided so as to cover irregularities on the TFT having wiring, and a display element formed on the planarizing film, the planarizing film being a cured film formed by curing the photosensitive colored resin composition.

An active matrix type display device includes a substrate of glass, various plastics, or the like, a TFT and wiring located on the side of the TFT and connected to the TFT provided on the substrate, a planarizing film located on top of it so as to cover surface irregularities, and display elements provided on the planarizing film. The display elements and wiring are connected via contact holes formed in the planarizing film.

FIG. 1 gives a cross section of such a TFT substrate. Bottom gate type or top gate type TFTs 1 are provided along lines on a substrate 6, and an insulation film 3 is provided so as to cover these type TFTs 1. Wires 2 connected to the TFTs 1 are provided on this insulation film 3. On top of the insulation film 3, furthermore, a planarizing film 4 is provided to embed the wires 2. The planarizing film 4 contains contact holes 7 that reach the wires 2. ITOs (transparent electrodes) 5 are provided on the planarizing film 4 so that they are connected to wires 2 through these contact holes 7. Here, the ITOs 5 work as electrodes for display elements (for example, organic EL elements). Then, insulation layers 8 are provided to cover the peripheries of the ITOs 5. These organic EL elements may be either top emission type ones to emit luminescent light from the surface located opposite to the substrate 6 or bottom emission type ones to emit light from the substrate 6, of which top emission type ones are preferred. Thus, an active matrix type organic EL display device in which each organic EL element is connected to a TFT 1 to drive it is obtained.

In the case of an organic EL display apparatus that uses TFTs having semiconductor layers of amorphous silicon, microcrystal silicon, or a metal oxide such as IGZO, for example, there can occur undesirable phenomena such as degradation, malfunction, and electric current leakage caused by ultraviolet light with relatively high energy or light in the shorter visible wavelength range and visibility deterioration caused by external light reflection during outdoor use. A heat resistant colored resin film obtained from the photosensitive colored resin composition according to the present invention absorbs light in the shorter visible wavelength range of 450 nm or less and light in the visible light region. When used in such an organic EL display device, therefore, it works to prevent degradation, malfunction, and electric current leakage, as well as visibility deterioration caused by external light reflection during outdoor use, thus serving to ensure stable driving and light emission characteristics.

Application of the present invention to an organic EL apparatus that uses TFTs having metal oxide semiconductor layers is effective particularly when the apparatus is a high resolution one. The resolution is preferably 50 ppi or more, more preferably 100 ppi or more. An organic EL apparatus with a higher resolution tends to suffer more significantly from such undesirable phenomena as degradation, malfunction, and electric current leakage caused by incoming light as well as visibility deterioration caused by external light reflection during outdoor use. Accordingly, a heat resistant colored resin film obtained from the photosensitive colored resin composition according to the present invention can work more efficiently to depress these undesirable phenomena when applied to organic EL apparatuses with higher resolution.

Furthermore, heat resistant colored resin films produced from the photosensitive colored resin composition according to the present invention can also serve favorably as surface protecting film and interlayer insulation film in semiconductor devices such as LSI, adhesive and underfilling material used for enclosing devices in packages, cap material for prevention of copper migration, on-chip microlens in solid state image sensing devices, and planarizing film in various displays and solid state image sensing devices.

EXAMPLES

The present invention will be illustrated below in greater detail with reference to Examples etc., but it should be understood that the invention is not construed as being limited thereto. The evaluations of photosensitive colored resin composition samples described in Example are carried out using the following methods.

(1) Evaluation of Sensitivity

In each Example and Comparative example, a photosensitive colored resin composition (hereinafter, occasionally referred to as varnish) was prepared, spread over an 8 inch silicon wafer by spin-coating so that the film thickness would be 3.5 µm after development, and then dried by heating (prebaked) at 120° C. for 80 seconds using a hot plate (Act-8 coating and development apparatus, manufactured by Tokyo Electron Ltd.) to provide a prebaked film. The prebaked film samples obtained were exposed to light using ghi-line mask aligners (PEM-6M, manufactured by Union Optical Co., Ltd.) in steps of 20 mJ/cm$^2$ in the exposure range of 0 to 1000 mJ/cm$^2$. The line & space (L&S) size of each pattern used for the exposure was 1, 2, 3, 4, 5, 6, 7, 8, 9, 10, 15, 20, 30, 50, or 100 µm. After the exposure, the film was developed for 30 to 100 seconds in a 2.38 mass % aqueous tetramethyl ammonium (TMAH) solution (manufactured by Tama Chemicals Co., Ltd.) to reach an intended film thickness and rinsed with pure water to provide a relief pattern. Here, the thickness of the prebaked film and that of the developed film were measured with a Lambda Ace STM-602 optical interference type film thickness measuring apparatus manufactured by Dainippon Screen Mfg. Co., Ltd. assuming a refractive index of 1.629.

The minimum light exposure required to form a 1:1 line & space (L/S) pattern (20 µm) after light exposure and development was adopted as sensitivity.

(2) Evaluation of Light Transmittance of Photosensitive Colored Resin Composition A varnish sample was spread over a 5 cm×5 cm glass substrate by spin-coating so that the film thickness would be 1.5 µm after heat treatment (curing) and prebaked at 120° C. for 80 seconds. Then, the film was cured for 60 minutes in an nitrogen atmosphere at 250° C. using a CLH-21 CD(V)-S high temperature clean oven manufactured by Koyo Thermo Systems Co., Ltd. to provide a heat resistant colored resin film. Here, the polyimide-based thickness of the heat resistant colored resin film was measured with a Lambda Ace STM-602 optical interference type film thickness measuring apparatus manufactured by Dainippon Screen Mfg. Co., Ltd. assuming a refractive index of 1.629. The heat resistant colored resin film thus obtained was analyzed by an ultraviolet and visible spectrophotometer (MultiSpec-1500, manufactured by Shimadzu Corporation) to determine the transmission spectrum at wavelengths of 300 nm to 800 nm. A sample with a 400 to 450 nm light transmittance of 60% or more was judged to be inferior and rated as 1, while a sample with a 400 to 450 nm light transmittance of 60% or less was judged to be good and rated as 2. A sample with a 400 to 650 nm light transmittance of 60% or less was judged to be excellent and rated as 3. When a cured film had a film thickness not equal to 1.5 µm, the measured light transmittance was converted for a film thickness of 1.5 µm.

(3) Evaluation of Water Absorption Rate

A varnish sample was spread over an 8 inch silicon wafer by spin-coating so that the thickness would be 10.0 µm after curing and prebaked at 120° C. for 80 seconds using a hot plate (Act-8 coating and development apparatus, manufactured by Tokyo Electron Ltd.) to provide a prebaked film. Then, the resulting prebaked film was cured for 60 minutes in an nitrogen atmosphere at 250° C. using a CLH-21 CD(V)-S high temperature clean oven manufactured by Koyo Thermo Systems Co., Ltd. to provide a heat resistant colored resin film. Here, the thickness of the heat resistant colored resin film was measured with a Lambda Ace STM-602 optical interference type film thickness measuring apparatus manufactured by Dainippon Screen Mfg. Co., Ltd. assuming a refractive index of 1.629. The heat resistant colored resin film thus produced was removed from the silicon wafer using hydrofluoric acid and a 10 mg sample was taken from the heat resistant colored resin film and treated at 70° C. for 20 minutes, followed by calculating the water absorption rate from the decrease in weight due to the treatment determined by a thermogravimetric apparatus (TGA-50, manufactured by Shimadzu Corporation).

(4) Evaluation of Photodegradation of Oxide TFT Substrate Due to Application of Negative Bias Potential An oxide TFT substrate incorporating a planarizing film prepared in an Example or Comparative example was produced by the procedure described below.

Bottom gate type oxide TFTs designed to have a resolution of 50 ppi were formed on a glass substrate and an insulation film of $Si_3N_4$ was formed to cover these TFTs. Then, contact holes were formed in this insulation film and wiring (height 1.0 μm) connecting to the TFTs through these contact holes was formed on the insulation film. In addition, in order to planarize the surface roughened by the wiring formation, a planarizing film was formed on the insulation film in such a manner that the surface irregularities resulting from the wiring formation were confined. The formation of a planarizing film on an insulation film was carried out by spin-coating a substrate with a varnish of a photosensitive colored resin composition prepared in an Example or Comparative example, prebaking it at 120° C. for 2 minutes on a hot plate, and curing it at 250° C. for 60 minutes in a nitrogen flow. The planarizing film prepared had a film thickness of 2.0 μm.

Then, an oxide TFT substrate incorporating a planarizing film prepared in an Example or Comparative example was exposed to light, after setting the gate-source bias potential to −20 V and the gate-drain potential to 10 V, under the exposure conditions of the use of a blue LED (<460 nm), an optical intensity of 0.07 mW/cm², and an exposure time of 10,000 seconds, using a semiconductor characteristics evaluation system (4200-SCS, manufactured by Keithley Instruments), followed by calculating the change in threshold voltage ΔVth caused by light exposure to represent the photodegradation that occurred during the application of a negative bias potential.

(5) Evaluation of External Light Reflection

A varnish sample was spread over a 5 cm×5 cm Ag-sputtered glass substrate by spin-coating so that the film thickness would be 1.5 μm after curing and prebaked at 120° C. for 80 seconds. Then, the film was cured for 60 minutes in an nitrogen atmosphere at 250° C. using a CLH-21 CD(V)-S high temperature clean oven manufactured by Koyo Thermo Systems Co., Ltd. to provide a heat resistant colored resin film. The glass substrate thus obtained was examined to determine its reflectance using a spectral colorimeter (CM-2600d, manufactured by Konica Minolta, Inc.).

(Synthesis Example 1) Synthesis of Hydroxyl-Containing Diamine Compounds

First, 18.3 g (0.05 mole) of 2,2-bis(3-amino-4-hydroxyphenyl) hexafluoropropane (hereinafter occasionally referred to as BAHF, manufactured by Central Glass Co., Ltd.) was dissolved in 100 mL of acetone and 17.4 g (0.3 mole) of propylene oxide (manufactured by Tokyo Chemical Industry Co., Ltd.), and cooled to −15° C. Then, a solution of 20.4 g (0.11 mole) of 3-nitrobenzoyl chloride (manufactured by Tokyo Chemical Industry Co., Ltd.) dissolved in 100 mL of acetone was added dropwise. After the end of dropwise addition, the solution was stirred at −15° C. for 4 hours, followed by leaving it to return to room temperature. The white solid precipitate was separated by filtration and vacuum-dried at 50° C.

A 30 g portion of the resulting white solid was put in a 300 mL stainless steel autoclave and dispersed in 250 mL of methyl cellosolve, followed by adding 2 g of 5% palladium-carbon (manufactured by Wako Pure Chemical Industries, Ltd.). Then, a balloon was used to introduce hydrogen into the solution to cause reduction reaction at room temperature. In about 2 hours, the reaction was finished after checking that the balloon would be deflated no more. After the end of the reaction, the solution was filtrated to remove the palladium compound used as catalyst and concentrated in a rotary evaporator to provide hydroxyl-containing diamine compound as represented by the formula given below.

[Chemical compound 12]

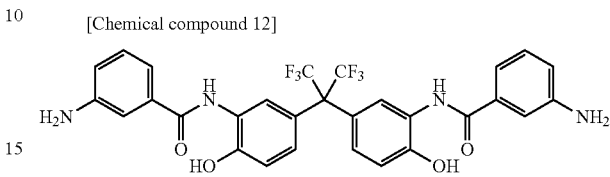

(Synthesis Example 2) Synthesis of Polyimide Precursor (A-1)

In a dry nitrogen flow, 15.1 g (0.025 mole) of the hydroxyl-containing diamine prepared in Synthesis example 1, 3.66 g (0.01 mole) of 2,2-bis(3-amino-4-hydroxyphenyl) hexafluoropropane (BAHF), and 0.62 g (0.0025 mole) of 1,3-bis(3-aminopropyl) tetramethyl disiloxane (hereinafter occasionally referred to as SiDA) were dissolved in 200 g of N-methyl pyrolidone (hereinafter occasionally referred to as NMP). To this solution, 22.2 g (0.05 mole) of 2,2-bis(3,4-dicarboxyphenyl) hexafluoropropane dianhydride (hereinafter occasionally referred to as 6 FDA) was added, followed by stirring at 40° C. for 1 hour. Then, 2.73 g (0.025 mole) of 3-aminophenol (hereinafter occasionally referred to as MAP, manufactured by Tokyo Chemical Industry Co., Ltd.) was added, and stirring was continued at 40° C. for 1 hours. Furthermore, a solution prepared by diluting 11.9 g (0.1 mole) of dimethylformamide dimethyl acetal (hereinafter occasionally referred to as DFA, manufactured by Mitsubishi Rayon Co., Ltd.) with 5 g of NMP was added dropwise over 10 minutes. After the dropping step, stirring was continued at 40° C. for 2 hours. After the stirring step, the solution was poured in 2L of water, and the resulting polymer solid precipitate was collected by filtration. In addition, washing in 2L of water was performed three times, and the collected solid polymer material was dried in a vacuum dryer at 50° C. for 72 hours to provide a polyamic acid ester (A-1).

(Synthesis Example 3) Synthesis of Polyimide Resin (A-2)

In a dry nitrogen flow, 29.30 g (0.08 mole) of 2,2-bis(3-amino-4-hydroxyphenyl) hexafluoropropane (BAHF), 1.24 g (0.005 mole) of SiDA, and 3.27 g (0.03 mole) of 3-aminophenol (manufactured by Tokyo Chemical Industry Co., Ltd.) used as end capping agent were dissolved in 80 g of NMP. To this solution, 31.2 g (0.1 mole) of bis(3,4-dicarboxyphenyl) ether dianhydride (hereinafter occasionally referred to as ODPA, manufactured by Manac Incorporated) and 20 g of NMP were added to allow them to react at 60° C. for 1 hour, followed by stirring at 180° C. for 4 hours. After the end of the stirring step, the solution was poured in 3 L of water to produce white precipitate. This precipitate was collected by filtration, rinsed with water three times, and dried in a vacuum dryer at 80° C. for 20 hours to provide powder of an alkali-soluble polyimide resin (A-2).

(Synthesis Example 4) Synthesis of Phenol Resin (A-3)

In a dry nitrogen flow, 70.2 g (0.65 mole) of m-cresol, 37.8 g (0.35 mole) of p-cresol, 75.5 g (formaldehyde 0.93 mole) of a 37 mass % aqueous formaldehyde solution, 0.63 g (0.005 mole) of oxalic acid dihydrate, and 264 g of methyl isobutyl ketone were fed to a flask, which was then immersed in an oil bath and subjected to condensation polymerization reaction for 4 hours while refluxing the reaction liquid. Subsequently, the temperature of the oil bath was increased by heating for 3 hours, and then the pressure in the flask was reduced to 40 to 67 hPa to remove volatile matters, followed by cooling to room temperature to provide a solid polymer of phenol resin (A-3).

(Synthesis Example 5) Synthesis of Polyhydroxystyrene Resin (A-4)

In a dry nitrogen flow, 500 ml of tetrahydrofuran and 0.01 mole of sec-butyllithium, used as initiator, were combined to prepare a mixed solution, and a total of 20 g of a mixture of p-t-butoxystyrene and styrene mixed at a molar ratio of 3:1 was add, followed by performing polymerization while stirring for 3 hours. The polymerization was terminated by adding 0.1 mole of methanol to the reaction solution. To refine the polymer, the reaction mixture was then poured in methanol and the resulting polymer precipitate was dried to provide a white polymer. Subsequently, the white polymer was dissolved in 400 ml of acetone and, after adding a small amount of concentrated hydrochloric acid at 60° C., stirred for 7 hours, and poured in water to precipitate a polymer material. Then the p-t-butoxy styrene was deprotected for conversion into hydroxystyrene, followed by washing and drying to provide a refined copolymer of p-hydroxystyrene and styrene (A-4).

(Synthesis Example 6) Synthesis of Siloxane Polymer (A-5)

In a dry nitrogen flow, 54.48 g (0.40 mole) of methyl trimethoxysilane, 99.15 g (0.50 mole) of phenyl trimethoxysilane, 12.32 g (0.05 mole) of 2-(3,4-epoxycyclohexyl) ethyl trimethoxysilane, 5.88 g (equivalent to 0.05 mole of Si atom) of M Silicate 51 (manufactured by Tama Chemicals Co., Ltd.), and 155.04 g of propylene glycol monomethyl ether acetate (hereinafter occasionally referred to as PGMEA) were fed to a 500 ml three-necked flask, and an aqueous phosphoric acid solution prepared by dissolving 0.515 g (accounting for 0.30 part by mass relative to the monomers fed) of phosphoric acid in 54.45 g of water was added gradually over 10 minutes while stirring at room temperature. Subsequently, the flask was immersed in an oil bath at 40° C., followed by stirring for 60 minutes and then heating the oil bath up to 115° C. over 30 minutes. One hour after the start of heating, the internal temperature of the solution reached 100° C. and heating was continued while stirring for additional 2 hours (the internal temperature was maintained at 100° C.) to provide a siloxane polymer solution (A-5).

(Synthesis Example 7) Synthesis of Cyclic Olefin Polymer (A-6)

In a dry nitrogen flow, 120 g (0.62 mole) of 8-hydroxycarbonyl tetracyclo[4.4.0.1$^{2,5}$.1$^{7,10}$] dodeca-3-en as a cyclic olefin monomer having a protonic polar group, 80 g (0.45 mole) of N-phenyl-(5-norbornene-2,3-dicarboxyimide) as a cyclic olefin monomer having no protonic polar group, 5.6 g (0.07 mole) of 1,5-hexadiene as a cyclic olefin monomer having no polar group, 0.1 g of (1,3-dimesitylimidazolidine-2-ylidene) (tricyclohexylphosphine) benzylideneruthenium dichloride, and 800 g of PGMEA were fed to a pressure resistant glass reaction vessel purged with nitrogen and subjected to polymerization reaction while stirring at 80° C. for 2 hours to provide a polymerization reaction solution containing a ring opening metathesis polymer.

Then, 0.2 g of bis(tricyclohexylphosphine) ethoxymethylene ruthenium dichloride, used as hydrogenation catalyst, was added to the polymerization reaction solution and hydrogen was dissolved under a pressure of 4 MPa for 5 hours to accelerate the hydrogenated reaction, followed by adding 2 g of activated carbon powder and dissolving hydrogen while stirring at 150° C. for 3 hours under a pressure of 4 MPa in an autoclave. Subsequently, the solution was taken out and filtered through a fluororesin filter with a pore size of 0.2 μm to separate the activated carbon to provide a cyclic olefin polymer (A-6) as a hydrogenation product of the ring opening metathesis polymer.

(Synthesis Example 8) Synthesis of Cardo Resin (A-7)

In a dry nitrogen flow, 198.53 g of a 50% PGMEA solution of the product of reaction of bisphenol fluorene type epoxy resin with an equivalent quantity of acrylic acid (a solution of ASF-400 (product name), manufactured by Nippon Steel Chemical Co., Ltd.), 39.54 g (0.12 mole) of benzophenone tetracarboxylic acid dianhydride, 8.13 g (0.08 mole) of succinic anhydride, 48.12 g of PGMEA, and 0.45 g of triphenyl phosphine were fed to a four-necked flask with a reflux condenser, heated while stirring at 120 to 125° C. for 1 hour, and additionally heated while stirring at 75 to 80° C. for 6 hours, followed by adding 8.6 g of glycidylmethacrylate and further stirring at 80° C. for 8 hours to provide cardo resin (A-7).

(Synthesis Example 9) Synthesis of Quinone Diazide Compound (B-1)

In a dry nitrogen flow, 42.4 g (0.1 mole) of 4,4'-[1-[4-[1-(4-hydroxyphenyl-1)-1-methylethyl] phenyl] ethylidene] bisphenol (hereinafter occasionally referred to as TrisP-PA, manufactured by Honshu Chemical Industry Co., Ltd.) and 72.3 g (0.27 mole) of 4-naphthoquinone diazide sulfonic acid chloride (NAC-4, manufactured by Toyo Gosei Co., Ltd.) were dissolved in 450 g of 1,4-dioxane and maintained at room temperature. To this solution, 25.0 g of triethyl amine mixed with 100 g of 1,4-dioxane was added dropwise while maintaining the system below 35° C. After the dropping step, it was stirred at 40° C. for 2 hours. The triethylamine salt was filtered and the filtrate was put in water. Subsequently, the resulting precipitate was collected by filtration, and then washed with 1 L of a 1% hydrochloric acid solution. In addition, washing in 2 L of water was carried out twice. The precipitate was then dried in a vacuum dryer to provide a quinone diazide compound (B-1) as represented by the formula given below (maximum absorption wavelength in the wavelength range of 350 nm or more and 450 nm or less located at 380 nm).

[Chemical compound 13]

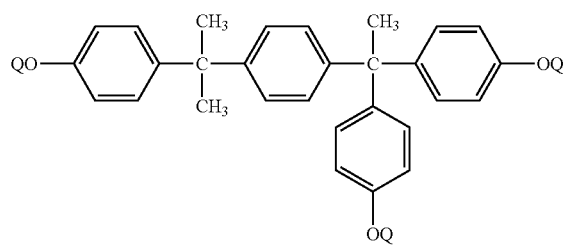

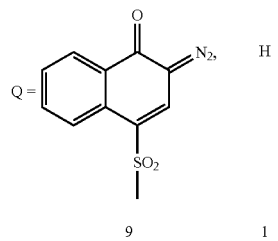

(Synthesis Example 10) Synthesis of Quinone Diazide Compound (B-2)

In a dry nitrogen flow, 42.4 g (0.1 mole) of 4,4'-[1-[4-[1-(4-hydroxyphenyl-1)-1-methylethyl] phenyl] ethylidene] bisphenol (hereinafter referred to as TrisP-PA, manufactured by Honshu Chemical Industry Co., Ltd.) and 72.3 g (0.27 mole) of 5-naphthoquinone diazide sulfonic acid chloride (NAC-5, manufactured by Toyo Gosei Co., Ltd.) were dissolved in 450 g of 1,4-dioxane and maintained at room temperature. To this solution, 25.0 g of triethyl amine mixed with 100 g of 1,4-dioxane was added dropwise while maintaining the system below 35° C. After the dropping step, it was stirred at 40° C. for 2 hours. The triethylamine salt was filtered and the filtrate was put in water. Subsequently, the resulting precipitate was collected by filtration, and then washed with 1 L of a 1% hydrochloric acid solution. In addition, washing in 2 L of water was carried out twice. The precipitate was then dried in a vacuum dryer to provide a quinone diazide compound (B-2) as represented by the formula given below (maximum absorption wavelength in the wavelength range of 350 nm or more and 450 nm or less located at 400 nm).

[Chemical compound 14]

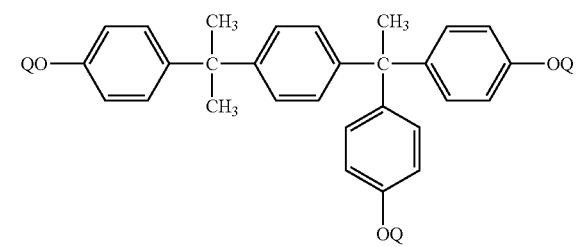

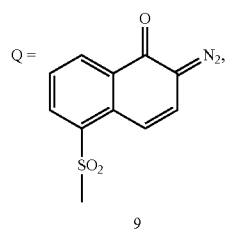

The other compounds used are listed below.

(B-3) Adeka ARKLS (registered trademark) NCI-831 (oxime ester based photopolymerization initiator, maximum absorption wavelength in the wavelength range of 350 nm or more and 450 nm or less located at 373 nm)

(F-1) KAYARAD (registered trademark) DPHA (dipentaerythritol hexaacrylate, manufactured by Nippon Kayaku Co., Ltd.)

Example 1

First, 10 g of the polyimide precursor (A-1) prepared in Synthesis example 2, used as the alkali-soluble resin (a), 3 g of the quinone diazide compound (B-1) prepared in Synthesis example 9, which corresponds to the photosensitive compound (b1) to work as the photosensitive compound (b), and 0.1 g of Plast Yellow 8070 (generally called C. I. Disperse Yellow 201, occasionally abbreviated as PY 8070, manufactured by Arimoto Chemical Co., Ltd.) (absorption maximum wavelength located at 445 nm), used as the compound (c) were weighed and dissolved in 50 g of γ-butyrolactone (hereinafter occasionally referred to as GBL) to provide varnish of a photosensitive colored resin composition. This varnish was used to prepare a prebaked film and its sensitivity was measured. The sensitivity was found to be 105 mJ/cm$^2$. It was then heat-treated, subjected to light transmittance measurement, and found to have a light transmittance at 400 to 450 nm of 60% or less. The water absorption rate was 1.20%.

Example 2

Except for adopting 2.7 g of the quinone diazide compound (B-1) prepared in Synthesis example 9, which corresponds to the photosensitive compound (b1) to work as the photosensitive compound (b), and 0.3 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 100 mJ/cm$^2$. It was then heat-treated, subjected to light transmittance measurement, and found to have a light transmittance at 400 to 450 nm of 60% or less. The water absorption rate was 1.00%.

Example 3

Except for adopting 2.4 g of the quinone diazide compound (B-1) prepared in Synthesis example 9, which corresponds to the photosensitive compound (b1) to work as the photosensitive compound (b), and 0.6 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 95 mJ/cm$^2$. It was then heat-treated, subjected to light transmittance measurement, and found to have a light transmittance at 400 to 450 nm of 60% or less. The water absorption rate was 0.95%.

Example 4

Except for adopting 1.8 g of the quinone diazide compound (B-1) prepared in Synthesis example 9, which corresponds to the photosensitive compound (b1) to work as the photosensitive compound (b), and 1.2 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 95 mJ/cm$^2$. It was then heat-treated, subjected to light transmittance measurement, and found to have a light transmittance at 400 to 450 nm of 60% or less. The water absorption rate was 0.90%.

Example 5

Except for adopting 1.2 g of the quinone diazide compound (B-1) prepared in Synthesis example 9, which corresponds to the photosensitive compound (b1) to work as the photosensitive compound (b), and 1.8 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 93 mJ/cm$^2$. It was then heat-treated, subjected to light transmittance measurement, and found to have a light transmittance at 400 to 450 nm of 60% or less. The water absorption rate was 0.86%.

Example 6

Except for adopting 0.6 g of the quinone diazide compound (B-1) prepared in Synthesis example 9, which corresponds to the photosensitive compound (b1) to work as the photosensitive compound (b), and 2.4 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 100 mJ/cm$^2$. It was then heat-treated, subjected to light transmittance measurement, and found to have a light transmittance at 400 to 450 nm of 60% or less. The water absorption rate was 0.81%.

Example 7

Except for adopting 0.3 g of the quinone diazide compound (B-1) prepared in Synthesis example 9, which corresponds to the photosensitive compound (b1) to work as the photosensitive compound (b), and 2.7 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 105 mJ/cm$^2$. It was then heat-treated, subjected to light transmittance measurement, and found to have a light transmittance at 400 to 450 nm of 60% or less. The water absorption rate was 0.77%.

Example 8

Except for adopting 0.15 g of the quinone diazide compound (B-1) prepared in Synthesis example 9, which corresponds to the photosensitive compound (b1) to work as the photosensitive compound (b), and 2.85 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 110 mJ/cm$^2$. It was then heat-treated, subjected to light transmittance measurement, and found to have a light transmittance at 400 to 450 nm of 60% or less. The water absorption rate was 0.72%.

Example 9

Except for adopting 0.12 g of the quinone diazide compound (B-1) prepared in Synthesis example 9, which corresponds to the photosensitive compound (b1) to work as the photosensitive compound (b), and 2.88 g of the quinone diazide compound (B-2) prepared in Synthesis example 10, which does not corresponds to the photosensitive compound (b1), the same procedure as in Example 1 was carried out to produce varnish of a photosensitive colored resin composition. This varnish was used to prepare a prebaked film and its sensitivity was measured. The sensitivity was found to be 125 mJ/cm$^2$. It was then heat-treated, subjected to light transmittance measurement, and found to have a light transmittance at 400 to 450 nm of 60% or less. The water absorption rate was 0.68%.

Example 10

Except for adopting 0.6 g of 1,8-naphthalimide trifluoromethanesulfonate (maximum absorption wavelength in the wavelength range of 350 nm or more and 450 nm or less located at 350 nm), which corresponds to the photosensitive compound (b1), instead of the quinone diazide compound (B-1) prepared in Synthesis example 9, which corresponds to the photosensitive compound (b1), the same procedure as in Example 6 was carried out to produce varnish of a photosensitive colored resin composition. This varnish was used to prepare a prebaked film and its sensitivity was measured. The sensitivity was found to be 110 mJ/cm$^2$. It was then heat-treated, subjected to light transmittance measurement, and found to have a light transmittance at 400 to 450 nm of 60% or less. The water absorption rate was 1.10%.

Comparative Example 1

Except for not using Plast Yellow 8070, the same procedure as in Example 1 was carried out to produce varnish of a photosensitive colored resin composition. This varnish was used to prepare a prebaked film and its sensitivity was measured. The sensitivity was found to be 90 mJ/cm$^2$. It was then heat-treated, subjected to light transmittance measurement, and found to have a light transmittance at 400 to 450 nm of more than 60%. The water absorption rate was 1.35%.

Comparative Example 2

Except that only 3.0 g of the quinone diazide compound (B-2) prepared in Synthesis example 10, which does not correspond to the photosensitive compound (b1), was adopted as the photosensitive compound (b), the same procedure as in Example 1 was carried out to produce varnish of a photosensitive colored resin composition. This varnish was used to prepare a prebaked film and its sensitivity was measured. The sensitivity was found to be 130 mJ/cm². It was then heat-treated, subjected to light transmittance measurement, and found to have a light transmittance at 400 to 450 nm of 60% or less. The water absorption rate was 0.60%.

Comparative Example 3

Except that only 0.3 g of Oil Scarlet 5206 (generally called C. I. Solvent Red 18, hereinafter occasionally abbreviated as OS 5206, manufactured by Arimoto Chemical Co., Ltd.) (absorption maximum wavelength located at 515 nm), which corresponds to the compound (d), was adopted instead of using Plast Yellow 8070 as the compound (c), the same procedure as in Example 5 was carried out to produce varnish of a photosensitive colored resin composition. This varnish was used to prepare a prebaked film and its sensitivity was measured. The sensitivity was found to be 105 mJ/cm². It was then heat-treated, subjected to light transmittance measurement, and found to have a light transmittance at 400 to 450 nm of more than 60%. The water absorption rate was 0.95%.

Comparative Example 4

Except that only 0.6 g of Plast Blue 8540 (generally called C. I. Solvent Blue 63, hereinafter occasionally abbreviated as PB 8540, manufactured by Arimoto Chemical Co., Ltd.) (absorption maximum wavelength located at 645 nm), which corresponds to the compound (e), was adopted instead of using Plast Yellow 8070 as the compound (c), the same procedure as in Example 5 was carried out to produce varnish of a photosensitive colored resin composition. This varnish was used to prepare a prebaked film and its sensitivity was measured. The sensitivity was found to be 110 mJ/cm². It was then heat-treated, subjected to light transmittance measurement, and found to have a light transmittance at 400 to 450 nm of more than 60%. The water absorption rate was 0.95%.

Comparative Example 5

Except that only 0.3 g of 5-nitroacenaphthene (manufactured by Tokyo Chemical Industry Co., Ltd., absorption maximum wavelength located at 371 nm), which corresponds to none of the compounds (c) to (e), was adopted instead of using Plast Yellow 8070 as the compound (c), the same procedure as in Example 5 was carried out to produce varnish of a photosensitive colored resin composition. This varnish was used to prepare a prebaked film and its sensitivity was measured. The sensitivity was found to be 400 mJ/cm². It was then heat-treated, subjected to light transmittance measurement, and found to have a light transmittance at 400 to 450 nm of 60% or less. The water absorption rate was 1.05%.

Example 11

Except for adopting 10 g of the polyimide resin (A-2), prepared in Synthesis example 3, as the alkali-soluble resin (a), the same procedure as in Example 5 was carried out to produce varnish of a photosensitive colored resin composition. This varnish was used to prepare a prebaked film and its sensitivity was measured. The sensitivity was found to be 140 mJ/cm². It was then heat-treated, subjected to light transmittance measurement, and found to have a light transmittance at 400 to 450 nm of 60% or less.

Example 12

Except for adopting 10 g of the phenol resin (A-3), prepared in Synthesis example 4, as the alkali-soluble resin (a), the same procedure as in Example 5 was carried out to produce varnish of a photosensitive colored resin composition. This varnish was used to prepare a prebaked film and its sensitivity was measured. The sensitivity was found to be 95 mJ/cm². It was then heat-treated, subjected to light transmittance measurement, and found to have a light transmittance at 400 to 450 nm of 60% or less.

Example 13

Except for adopting 10 g of the polyhydroxystyrene resin (A-4), prepared in Synthesis example 5, as the alkali-soluble resin (a), the same procedure as in Example 5 was carried out to produce varnish of a photosensitive colored resin composition. This varnish was used to prepare a prebaked film and its sensitivity was measured. The sensitivity was found to be 115 mJ/cm². It was then heat-treated, subjected to light transmittance measurement, and found to have a light transmittance at 400 to 450 nm of 60% or less.

Example 14

Except for adopting 10 g of the siloxane polymer (A-5), prepared in Synthesis example 6, as the alkali-soluble resin (a), and using PGMEA as solvent, the same procedure as in Example 5 was carried out to produce varnish of a photosensitive colored resin composition. This varnish was used to prepare a prebaked film and its sensitivity was measured. The sensitivity was found to be 145 mJ/cm². It was then heat-treated, subjected to light transmittance measurement, and found to have a light transmittance at 400 to 450 nm of 60% or less.

Example 15

Except for adopting 10 g of the cyclic olefin polymer (A-6), prepared in Synthesis example 7, as the alkali-soluble resin (a), and using PGMEA as solvent, the same procedure as in Example 5 was carried out to produce varnish of a photosensitive colored resin composition. This varnish was used to prepare a prebaked film and its sensitivity was measured. The sensitivity was found to be 145 mJ/cm². It was then heat-treated, subjected to light transmittance measurement, and found to have a light transmittance at 400 to 450 nm of 60% or less.

Example 16

Except for adopting 10 g of the cardo resin (A-7), prepared in Synthesis example 8, as the alkali-soluble resin (a), and using PGMEA as solvent, the same procedure as in Example 5 was carried out to produce varnish of a photosensitive colored resin composition. This varnish was used to prepare a prebaked film and its sensitivity was measured. The sensitivity was found to be 150 mJ/cm². It was then heat-treated, subjected to light transmittance measurement, and found to have a light transmittance at 400 to 450 nm of 60% or less.

Example 17

Except for adopting 8 g of the polyamic acid precursor (A-1), prepared in Synthesis example 2, and 2 g of the phenol resin (A-3), prepared in Synthesis example 4, as the alkali-soluble resin (a), the same procedure as in Example 5 was carried out to produce varnish of a photosensitive colored resin composition. This varnish was used to prepare a prebaked film and its sensitivity was measured. The sensitivity was found to be 95 mJ/cm$^2$. It was then heat-treated, subjected to light transmittance measurement, and found to have a light transmittance at 400 to 450 nm of 60% or less.

Comparative Example 6

Except for using 3.0 g of the quinone diazide compound (B-2), prepared in Synthesis example 10, which does not correspond to the photosensitive compound (b1), alone as the photosensitive compound (b), the same procedure as in Example 11 was carried out to produce varnish of a photosensitive colored resin composition. This varnish was used to prepare a prebaked film and its sensitivity was measured. The sensitivity was found to be 190 mJ/cm$^2$. It was then heat-treated, subjected to light transmittance measurement, and found to have a light transmittance at 400 to 450 nm of 60% or less.

Comparative Example 7

Except for using 3.0 g of the quinone diazide compound (B-2), prepared in Synthesis example 10, which does not correspond to the photosensitive compound (b1), alone as the photosensitive compound (b), the same procedure as in Example 12 was carried out to produce varnish of a photosensitive colored resin composition. This varnish was used to prepare a prebaked film and its sensitivity was measured. The sensitivity was found to be 130 mJ/cm$^2$. It was then heat-treated, subjected to light transmittance measurement, and found to have a light transmittance at 400 to 450 nm of 60% or less.

Comparative Example 8

Except for using 3.0 g of the quinone diazide compound (B-2), prepared in Synthesis example 10, which does not correspond to the photosensitive compound (b1), alone as the photosensitive compound (b), the same procedure as in Example 13 was carried out to produce varnish of a photosensitive colored resin composition. This varnish was used to prepare a prebaked film and its sensitivity was measured. The sensitivity was found to be 150 mJ/cm$^2$. It was then heat-treated, subjected to light transmittance measurement, and found to have a light transmittance at 400 to 450 nm of 60% or less.

Comparative Example 9

Except for using 3.0 g of the quinone diazide compound (B-2), prepared in Synthesis example 10, which does not correspond to the photosensitive compound (b1), alone as the photosensitive compound (b), the same procedure as in Example 14 was carried out to produce varnish of a photosensitive colored resin composition. This varnish was used to prepare a prebaked film and its sensitivity was measured. The sensitivity was found to be 200 mJ/cm$^2$. It was then heat-treated, subjected to light transmittance measurement, and found to have a light transmittance at 400 to 450 nm of 60% or less.

Comparative Example 10

Except for using 3.0 g of the quinone diazide compound (B-2), prepared in Synthesis example 10, which does not correspond to the photosensitive compound (b1), alone as the photosensitive compound (b), the same procedure as in Example 15 was carried out to produce varnish of a photosensitive colored resin composition. This varnish was used to prepare a prebaked film and its sensitivity was measured. The sensitivity was found to be 200 mJ/cm$^2$. It was then heat-treated, subjected to light transmittance measurement, and found to have a light transmittance at 400 to 450 nm of 60% or less.

Comparative Example 11

Except for using 3.0 g of the quinone diazide compound (B-2), prepared in Synthesis example 10, which does not correspond to the photosensitive compound (b1), alone as the photosensitive compound (b), the same procedure as in Example 16 was carried out to produce varnish of a photosensitive colored resin composition. This varnish was used to prepare a prebaked film and its sensitivity was measured. The sensitivity was found to be 200 mJ/cm$^2$. It was then heat-treated, subjected to light transmittance measurement, and found to have a light transmittance at 400 to 450 nm of 60% or less.

Comparative Example 12

Except for using 3.0 g of the quinone diazide compound (B-2), prepared in Synthesis example 10, which does not correspond to the photosensitive compound (b1), alone as the photosensitive compound (b), the same procedure as in Example 17 was carried out to produce varnish of a photosensitive colored resin composition. This varnish was used to prepare a prebaked film and its sensitivity was measured. The sensitivity was found to be 130 mJ/cm$^2$. It was then heat-treated, subjected to light transmittance measurement, and found to have a light transmittance at 400 to 450 nm of 60% or less.

Example 18

Except for further adding 0.3 g of Oil Scarlet 5206, which corresponds to the compound (d), the same procedure as in Example 5 was carried out to produce varnish of a photosensitive colored resin composition. This varnish was used to prepare a prebaked film and its sensitivity was measured. The sensitivity was found to be 100 mJ/cm$^2$. It was then heat-treated, subjected to light transmittance measurement, and found to have a light transmittance at 400 to 450 nm of 60% or less.

Example 19

Except for further adding 0.6 g of Plast Blue 8540, which corresponds to the compound (e), the same procedure as in Example 5 was carried out to produce varnish of a photosensitive colored resin composition. This varnish was used to prepare a prebaked film and its sensitivity was measured. The sensitivity was found to be 110 mJ/cm$^2$. It was then heat-treated, subjected to light transmittance measurement, and found to have a light transmittance at 400 to 450 nm of 60% or less.

Example 20

Except for adopting 0.15 g of Pigment Yellow 150 (trade name: E4GNGT, manufactured by Lanxess K.K.) (absorption maximum wavelength located at 425 nm), instead of Plast Yellow 8070, as the compound (c), the same procedure as in Example 5 was carried out to produce varnish of a photosensitive colored resin composition. This varnish was used to prepare a prebaked film and its sensitivity was measured. The sensitivity was found to be 105 mJ/cm$^2$. It was then heat-treated, subjected to light transmittance measurement, and found to have a light transmittance at 400 to 450 nm of 60% or less.

Example 21

Except for further adding 0.3 g of Oil Scarlet 5206, which corresponds to the compound (d), the same procedure as in Example 20 was carried out to produce varnish of a photosensitive colored resin composition. This varnish was used to prepare a prebaked film and its sensitivity was measured. The sensitivity was found to be 115 mJ/cm$^2$. It was then heat-treated, subjected to light transmittance measurement, and found to have a light transmittance at 400 to 450 nm of 60% or less.

Example 22

Except for further adding 0.15 g of Pigment Red 254 (trade name: Irgaphor Red BK-CF, manufactured by Ciba Specialty Chemicals) (absorption maximum wavelength located at 550 nm), the same procedure as in Example 20 was carried out to produce varnish of a photosensitive colored resin composition. This varnish was used to prepare a prebaked film and its sensitivity was measured. The sensitivity was found to be 125 mJ/cm$^2$. It was then heat-treated, subjected to light transmittance measurement, and found to have a light transmittance at 400 to 450 nm of 60% or less.

Example 23

Except for further adding 0.3 g of Oil Scarlet 5206, which corresponds to the compound (d), and 0.6 g of Plast Blue 8540, which corresponds to compound (e), the same procedure as in Example 5 was carried out to produce varnish of a photosensitive colored resin composition. This varnish was used to prepare a prebaked film and its sensitivity was measured. The sensitivity was found to be 100 mJ/cm$^2$. It was then heat-treated, subjected to light transmittance measurement, and found to have a light transmittance at 400 to 650 nm of 60% or less.

Example 24

Except for adopting 0.15 g of Pigment Yellow 150, instead of Plast Yellow 8070, as the compound (c), the same procedure as in Example 23 was carried out to produce varnish of a photosensitive colored resin composition. This varnish was used to prepare a prebaked film and its sensitivity was measured. The sensitivity was found to be 120 mJ/cm$^2$. It was then heat-treated, subjected to light transmittance measurement, and found to have a light transmittance at 400 to 650 nm of 60% or less.

Example 25

Except for adopting 0.15 g of Pigment Blue 15:6 (trade name: Lyonol Blue 7602, manufactured by Toyo Ink Co., Ltd.) (absorption maximum wavelength located at 670 nm), instead of Plast Blue 8540, as the compound (e), the same procedure as in Example 24 was carried out to produce varnish of a photosensitive colored resin composition. This varnish was used to prepare a prebaked film and its sensitivity was measured. The sensitivity was found to be 190 mJ/cm$^2$. It was then heat-treated, subjected to light transmittance measurement, and found to have a light transmittance at 400 to 650 nm of 60% or less.

Example 26

Except for adopting only 2.5 g of the photopolymerization initiator NCI-831 (B-3) as the photosensitive compound (b) and further adding 12.0 g of DPHA (F-1) as the radical polymerizable compound (f), the same procedure as in Example 23 was carried out to produce varnish of a photosensitive colored resin composition. This varnish was used to prepare a prebaked film and its sensitivity was measured. The sensitivity was found to be 120 mJ/cm$^2$. It was then heat-treated, subjected to light transmittance measurement, and found to have a light transmittance at 400 to 650 nm of 60% or less.

Example 27

Except for adopting 10 g of the polyimide resin (A-2), prepared in Synthesis example 3, as the alkali-soluble resin (a), the same procedure as in Example 26 was carried out to produce varnish of a photosensitive colored resin composition. This varnish was used to prepare a prebaked film and its sensitivity was measured. The sensitivity was found to be 110 mJ/cm$^2$. It was then heat-treated, subjected to light transmittance measurement, and found to have a light transmittance at 400 to 650 nm of 60% or less.

Comparative Example 13

Except for using only 3.0 g of the quinone diazide compound (B-2), prepared in Synthesis example 10, which does not correspond to the photosensitive compound (b1), as the photosensitive compound (b), the same procedure as in Example 18 was carried out to produce varnish of a photosensitive colored resin composition. This varnish was used to prepare a prebaked film and its sensitivity was measured. The sensitivity was found to be 135 mJ/cm$^2$. It was then heat-treated, subjected to light transmittance measurement, and found to have a light transmittance at 400 to 450 nm of 60% or less.

Comparative Example 14

Except for using only 3.0 g of the quinone diazide compound (B-2), prepared in Synthesis example 10, which does not correspond to the photosensitive compound (b1), as the photosensitive compound (b), the same procedure as in Example 19 was carried out to produce varnish of a photosensitive colored resin composition. This varnish was used to prepare a prebaked film and its sensitivity was measured. The sensitivity was found to be 135 mJ/cm$^2$. It was then heat-treated, subjected to light transmittance measurement, and found to have a light transmittance at 400 to 450 nm of 60% or less.

Comparative Example 15

Except for using only 3.0 g of the quinone diazide compound (B-2), prepared in Synthesis example 10, which does not correspond to the photosensitive compound (b1), as the photosensitive compound (b), the same procedure as in Example 20 was carried out to produce varnish of a photosensitive colored resin composition. This varnish was used to prepare a prebaked film and its sensitivity was measured. The sensitivity was found to be 140 mJ/cm². It was then heat-treated, subjected to light transmittance measurement, and found to have a light transmittance at 400 to 450 nm of 60% or less.

Comparative Example 16

Except for using only 3.0 g of the quinone diazide compound (B-2), prepared in Synthesis example 10, which does not correspond to the photosensitive compound (b1), as the photosensitive compound (b), the same procedure as in Example 21 was carried out to produce varnish of a photosensitive colored resin composition. This varnish was used to prepare a prebaked film and its sensitivity was measured. The sensitivity was found to be 170 mJ/cm². It was then heat-treated, subjected to light transmittance measurement, and found to have a light transmittance at 400 to 450 nm of 60% or less.

Comparative Example 17

Except for using only 3.0 g of the quinone diazide compound (B-2), prepared in Synthesis example 10, which does not correspond to the photosensitive compound (b1), as the photosensitive compound (b), the same procedure as in Example 22 was carried out to produce varnish of a photosensitive colored resin composition. This varnish was used to prepare a prebaked film and its sensitivity was measured. The sensitivity was found to be 250 mJ/cm². It was then heat-treated, subjected to light transmittance measurement, and found to have a light transmittance at 400 to 450 nm of 60% or less.

Comparative Example 18

Except for using only 3.0 g of the quinone diazide compound (B-2), prepared in Synthesis example 10, which does not correspond to the photosensitive compound (b1), as the photosensitive compound (b), the same procedure as in Example 23 was carried out to produce varnish of a photosensitive colored resin composition. This varnish was used to prepare a prebaked film and its sensitivity was measured. The sensitivity was found to be 140 mJ/cm². It was then heat-treated, subjected to light transmittance measurement, and found to have a light transmittance at 400 to 650 nm of 60% or less.

Comparative Example 19

Except for using only 3.0 g of the quinone diazide compound (B-2), prepared in Synthesis example 10, which does not correspond to the photosensitive compound (b1), as the photosensitive compound (b), the same procedure as in Example 24 was carried out to produce varnish of a photosensitive colored resin composition. This varnish was used to prepare a prebaked film and its sensitivity was measured. The sensitivity was found to be 160 mJ/cm². It was then heat-treated, subjected to light transmittance measurement, and found to have a light transmittance at 400 to 650 nm of 60% or less.

Comparative Example 20

Except for using only 3.0 g of the quinone diazide compound (B-2), prepared in Synthesis example 10, which does not correspond to the photosensitive compound (b1), as the photosensitive compound (b), the same procedure as in Example 25 was carried out to produce varnish of a photosensitive colored resin composition. This varnish was used to prepare a prebaked film and its sensitivity was measured. The sensitivity was found to be 240 mJ/cm². It was then heat-treated, subjected to light transmittance measurement, and found to have a light transmittance at 400 to 650 nm of 60% or less.

Then, using the varnish samples prepared in Examples 1 to 27 and Comparative example 1, thin film transistors were produced according to the procedure described in paragraph (4) "Evaluation of photodegradation of oxide TFT substrate due to application of negative bias potential", and subjected to characteristics evaluation. Thin film transistors incorporating planarizing films produced from the varnish samples prepared in Examples 1 to 27 each had a small value of ΔVth, i.e., absolute difference between the threshold voltage measurements taken before and after the photodegradation test, indicating that the thin film transistors high in quality. Compared to this, the thin film transistor incorporating the planarizing film produced from the varnish sample prepared in Comparative example 1 had a large ΔVth value, indicating a large degradation caused by light. This performance degradation is considered to be attributable to the fact that the cured film produced from the varnish sample prepared in Comparative example 1 did not have the function of absorbing light in the wavelength range of 450 nm or less.

Then, using the varnish samples prepared in Examples 18, 19, 21 to 25, and Comparative example 1 glass substrates were produced according to the procedure described in paragraph (5) "Evaluation of external light reflection" and subjected to reflectance measurement. Results showed that the glass substrates originating from Examples 18, 19, and 21 to 25 were smaller by 20% or more in reflectance than the one originating from Comparative example 1.

Organic EL display devices were produced and evaluated in terms of reflectance. Described below is the procedure used for the production of organic EL display devices. Bottom gate type oxide TFTs designed to have a resolution of 50 ppi were formed on a glass substrate and an insulation film of $Si_3N_4$ was formed to cover these TFTs. Then, contact holes were formed in this insulation film and wiring (height 1.0 µm) connecting to the TFTs through these contact holes was formed on the insulation film. This wiring was designed for connection among the TFTs and between the TFTs and organic EL elements that will be formed in a subsequent step.

In addition, in order to planarize the surface roughened by the wiring formation, a planarizing film was formed on the insulation film in such a manner that the surface irregularities resulting from the wiring formation were confined. The formation of a planarizing film on an insulation film was carried out by spin-coating a substrate with a varnish of a photosensitive colored resin composition prepared in an Example or Comparative example, prebaking it at 120° C. for 2 minutes on a hot plate, and curing it at 250° C. for 60 minutes in a nitrogen flow. Coatability was high in the varnish coating step and the heat resistant colored resin film resulting from subsequent exposure, development, and calcination was free of creasing or cracking. The wiring had an average height of 0.5 µm, and the planarizing film prepared had a film thickness of 2.0 µm.

Then, top emission type organic EL elements were formed on the resulting planarizing film. First, a bottom electrode made of ITO, which was connected to the wiring through the contact holes, was formed by sputtering on the planarizing film. Then, the surface was coated with a resist, prebaked, exposed to light through an appropriately patterned mask, and developed. Using this resist pattern as mask, patterning was performed by wet etching with an ITO etchant. Subsequently, the resist pattern was removed using a resist stripping liquid (a liquid mixture of monoethanol amine and DMSO (dimethyl sulfoxide)). The bottom electrode thus obtained corresponds to the anode of an organic EL element.

Next, an insulation layer was formed in a shape that covers the periphery of the bottom electrode. Varnish of a photosensitive colored resin composition prepared in an Example or Comparative example was used to form the insulation layer. The provision of this insulation layer serves to prevent short-circuiting between the bottom electrode and the top electrode that will be formed in a subsequent step. The insulation layer was patterned and heat-treated at 250° C. for 60 minutes to provide an insulation layer that absorbs light in the visible region.

In addition, a hole transport layer, red, green, and blue organic luminescent layers, and electron transport layer were deposited in this order through an appropriate pattern mask in a vacuum deposition apparatus. Subsequently, a top electrode of aluminum (Al) was formed over the entire surface above the substrate. This corresponds to the cathode of an organic EL element. The substrate obtained above was removed from the vapor deposition apparatus and sealed by adhering it to a sealing glass substrate with an ultraviolet curable epoxy resin.

Thus, an active matrix type organic EL display device having organic EL elements connected to TFTs that drive them was obtained. The organic EL display device was subjected to reflectance measurement. Results showed that the organic EL display devices originating from Examples 18, 19, and 21 to 27 were smaller by 20% or more in reflectance than the organic EL display device originating from Comparative example 1. The results suggest that the former can serve to reduce the visibility deterioration due to external light reflection.

The types and quantities of the photosensitive colored resin compositions used in Examples 1 to 10 and Comparative examples 1 to 5 are given in Table 1, and those used in Examples 11 to 17 and Comparative examples 6 to 12 are given in Table 2. Those used in Examples 18 to 27 and Comparative examples 13 to 20 are given in Table 3.

[Amendment 03.08.2016 According to Regulation 91]

TABLE 1

| | Type (quantity) of photosensitive colored resin composition | | |
|---|---|---|---|
| | Alkali-soluble resin (a) | Photosensitive compound (b) | Compound (c) |
| Example 1 | A-1 (10 g) | B-1 (3 g) | PY 8070 (absorption maximum wavelength 445 nm) (0.1 g) |
| Example 2 | A-1 (10 g) | B-1 (2.7 g) B-2 (0.3 g) | PY 8070 (absorption maximum wavelength 445 nm) (0.1 g) |
| Example 3 | A-1 (10 g) | B-1 (2.4 g) B-2 (0.6 g) | PY 8070 (absorption maximum wavelength 445 nm) (0.1 g) |
| Example 4 | A-1 (10 g) | B-1 (1.8 g) B-2 (1.2 g) | PY 8070 (absorption maximum wavelength 445 nm) (0.1 g) |
| Example 5 | A-1 (10 g) | B-1 (1.2 g) B-2 (1.8 g) | PY 8070 (absorption maximum wavelength 445 nm) (0.1 g) |
| Example 6 | A-1 (10 g) | B-1 (0.6 g) B-2 (2.4 g) | PY 8070 (absorption maximum wavelength 445 nm) (0.1 g) |
| Example 7 | A-1 (10 g) | B-1 (0.3 g) B-2 (2.7 g) | PY 8070 (absorption maximum wavelength 445 nm) (0.1 g) |
| Example 8 | A-1 (10 g) | B-1 (0.15 g) B-2 (2.85 g) | PY 8070 (absorption maximum wavelength 445 nm) (0.1 g) |
| Example 9 | A-1 (10 g) | B-1 (0.12 g) B-2 (2.88 g) | PY 8070 (absorption maximum wavelength 445 nm) (0.1 g) |
| Example 10 | A-1 (10 g) | 1,8-naphthalimide trifluoromethane-sulfonate (0.6 g) B-2 (2.4 g) | PY 8070 (absorption maximum wavelength 445 nm) (0.1 g) |
| Comparative example 1 | A-1 (10 g) | B-1 (3 g) | |
| Comparative example 2 | A-1 (10 g) | B-2 (3.0 g) | PY 8070 (absorption maximum wavelength 445 nm) (0.1 g) |
| Comparative example 3 | A-1 (10 g) | B-1 (1.2 g) B-2 (1.8 g) | |
| Comparative example 4 | A-1 (10 g) | B-1 (1.2 g) B-2 (1.8 g) | |
| Comparative example 5 | A-1 (10 g) | B-1 (1.2 g) B-2 (1.8 g) | |

| | Type (quantity) of photosensitive colored resin composition | |
|---|---|---|
| | Others | Solvent |
| Example 1 | | GBL (50 g) |
| Example 2 | | GBL (50 g) |
| Example 3 | | GBL (50 g) |
| Example 4 | | GBL (50 g) |
| Example 5 | | GBL (50 g) |
| Example 6 | | GBL (50 g) |
| Example 7 | | GBL (50 g) |
| Example 8 | | GBL (50 g) |
| Example 9 | | GBL (50 g) |

TABLE 1-continued

|  |  |  |
|---|---|---|
| Example 10 |  | GBL (50 g) |
| Comparative example 1 |  | GBL (50 g) |
| Comparative example 2 |  | GBL (50 g) |
| Comparative example 3 | (d) OS 5206 (absorption maximum wavelength 515 nm) (0.3 g) | GBL (50 g) |
| Comparative example 4 | (e) PB 8540 (absorption maximum wavelength 645 nm) (0.6 g) | GBL (50 g) |
| Comparative example 5 | 5-nitro acenaphthene (absorption maximum wavelength 371 nm) (0.3 g) | GBL (50 g) |

Abbreviations used in Table are as follows:
PY 8070: Plast Yellow 8070
OS 5206: Oil Scarlet 5206
PB 8540: Plast Blue 8540
GBL: γ-butyrolactone

[Amendment 03.08.2016 according to regulation 91]

TABLE 2

|  | Alkali-soluble resin (a) | Photosensitive compound (b) | Compound (c) | Other | Solvent |
|---|---|---|---|---|---|
| Example 11 | A-2 (10 g) | B-1 (1.2 g) B-2 (1.8 g) | PY 8070 (absorption maximum wavelength 445 nm) (0.1 g) |  | GBL (50 g) |
| Example 12 | A-3 (10 g) | B-1 (1.2 g) B-2 (1.8 g) | PY 8070 (absorption maximum wavelength 445 nm) (0.1 g) |  | GBL (50 g) |
| Example 13 | A-4 (10 g) | B-1 (1.2 g) B-2 (1.8 g) | PY 8070 (absorption maximum wavelength 445 nm) (0.1 g) |  | GBL (50 g) |
| Example 14 | A-5 (10 g) | B-1 (1.2 g) B-2 (1.8 g) | PY 8070 (absorption maximum wavelength 445 nm) (0.1 g) |  | PGMEA (50 g) |
| Example 15 | A-6 (10 g) | B-1 (1.2 g) B-2 (1.8 g) | PY 8070 (absorption maximum wavelength 445 nm) (0.1 g) |  | PGMEA (50 g) |
| Example 16 | A-7 (10 g) | B-1 (1.2 g) B-2 (1.8 g) | PY 8070 (absorption maximum wavelength 445 nm) (0.1 g) |  | PGMEA (50 g) |
| Example 17 | A-1 (8 g) A-3 (2 g) | B-1 (1.2 g) B-2 (1.8 g) | PY 8070 (absorption maximum wavelength 445 nm) (0.1 g) |  | GBL (50 g) |
| Comparative example 6 | A-2 (10 g) | B-2 (3.0 g) | PY 8070 (absorption maximum wavelength 445 nm) (0.1 g) |  | GBL (50 g) |
| Comparative example 7 | A-3 (10 g) | B-2 (3.0 g) | PY 8070 (absorption maximum wavelength 445 nm) (0.1 g) |  | GBL (50 g) |
| Comparative example 8 | A-4 (10 g) | B-2 (3.0 g) | PY 8070 (absorption maximum wavelength 445 nm) (0.1 g) |  | GBL (50 g) |
| Comparative example 9 | A-5 (10 g) | B-2 (3.0 g) | PY 8070 (absorption maximum wavelength 445 nm) (0.1 g) |  | PGMEA (50 g) |
| Comparative example 10 | A-6 (10 g) | B-2 (3.0 g) | PY 8070 (absorption maximum wavelength 445 nm) (0.1 g) |  | PGMEA (50 g) |
| Comparative example 11 | A-7 (10 g) | B-2 (3.0 g) | PY 8070 (absorption maximum wavelength 445 nm) (0.1 g) |  | PGMEA (50 g) |
| Comparative example 12 | A-1 (8 g) A-3 (2 g) | B-2 (3.0 g) | PY 8070 (absorption maximum wavelength 445 nm) (0.1 g) |  | GBL (50 g) |

Abbreviations used in Table are as follows:
PY 8070: Plast Yellow 8070
GBL: γ-butyrolactone
PGMEA: propylene glycol monomethyl ether acetate

[Amendment 03.08.2016 according to regulation 91]

TABLE 3

| | Type (quantity) of photosensitive colored resin composition | | |
|---|---|---|---|
| | Alkali-soluble resin (a) | Photosensitive compound (b) | Compound (c) |
| Example 18 | A-1 (10 g) | B-1 (1.2 g) B-2 (1.8 g) | PY 8070 (absorption maximum wavelength 445 nm) (0.1 g) |
| Example 19 | A-1 (10 g) | B-1 (1.2 g) B-2 (1.8 g) | PY 8070 (absorption maximum wavelength 445 nm) (0.1 g) |
| Example 20 | A-1 (10 g) | B-1 (1.2 g) B-2 (1.8 g) | Pigment Yellow 150 (absorption maximum wavelength 425 nm) (0.15 g) |
| Example 21 | A-1 (10 g) | B-1 (1.2 g) B-2 (1.8 g) | Pigment Yellow 150 (absorption maximum wavelength 425 nm) (0.15 g) |
| Example 22 | A-1 (10 g) | B-1 (1.2 g) B-2 (1.8 g) | Pigment Yellow 150 (absorption maximum wavelength 425 nm) (0.15 g) |

TABLE 3-continued

| | | | |
|---|---|---|---|
| Example 23 | A-1 (10 g) | B-1 (1.2 g) B-2 (1.8 g) | PY 8070 (absorption maximum wavelength 445 nm) (0.1 g) |
| Example 24 | A-1 (10 g) | B-1 (1.2 g) B-2 (1.8 g) | Pigment Yellow 150 (absorption maximum wavelength 425 nm) (0.15 g) |
| Example 25 | A-1 (10 g) | B-1 (1.2 g) B-2 (1.8 g) | Pigment Yellow 150 (absorption maximum wavelength 425 nm) (0.15 g) |
| Example 26 | A-1 (10 g) | B-3 (2.5 g) | PY 8070 (absorption maximum wavelength 445 nm) (0.1 g) |
| Example 27 | A-2 (100) | B-3 (2.5 g) | PY 8070 (absorption maximum wavelength 445 nm) (0.1 g) |
| Comparative example 13 | A-1 (10 g) | B-2 (3.0 g) | PY 8070 (absorption maximum wavelength 445 nm) (0.1 g) |
| Comparative example 14 | A-1 (10 g) | B-2 (3.0 g) | PY 8070 (absorption maximum wavelength 445 nm) (0.1 g) |
| Comparative example 15 | A-1 (10 g) | B-2 (3.0 g) | Pigment Yellow 150 (absorption maximum wavelength 425 nm) (0.15 g) |
| Comparative example 16 | A-1 (10 g) | B-2 (3.0 g) | Pigment Yellow 150 (absorption maximum wavelength 425 nm) (0.15 g) |
| Comparative example 17 | A-1 (10 g) | B-2 (3.0 g) | Pigment Yellow 150 (absorption maximum wavelength 425 nm) (0.15 g) |
| Comparative example 18 | A-1 (10 g) | B-2 (3.0 g) | PY 8070 (absorption maximum wavelength 445 nm) (0.1 g) |
| Comparative example 19 | A-1 (10 g) | B-2 (3.0 g) | Pigment Yellow 150 (absorption maximum wavelength 425 nm) (0.15 g) |
| Comparative example 20 | A-1 (10 g) | B-2 (3.0 g) | Pigment Yellow 150 (absorption maximum wavelength 425 nm) (0.15 g) |

| | Type (quantity) of photosensitive colored resin composition | |
|---|---|---|
| | Others | Solvent |
| Example 18 | (d) OS 5206 (absorption maximum wavelength 515 nm) (0.3 g) | GBL (50 g) |
| Example 19 | (e) PB 8540 (absorption maximum wavelength 645 nm) (0.6 g) | GBL (50 g) |
| Example 20 | | GBL (50 g) |
| Example 21 | (d) OS 5206 (absorption maximum wavelength 515 nm) (0.3 g) | GBL (50 g) |
| Example 22 | (d) Pigment red 254 (absorption maximum wavelength 550 nm) (0.15 g) | GBL (50 g) |
| Example 23 | (d) OS 5206 (absorption maximum wavelength 515 nm) (0.3 g) (e) PB 8540 (absorption maximum wavelength 645 nm) (0.6 g) | GBL (50 g) |
| Example 24 | (d) OS 5206 (absorption maximum wavelength 515 nm) (0.3 g) (e) PB 8540 (absorption maximum wavelength 645 nm) (0.6 g) | GBL (50 g) |
| Example 25 | (d) OS 5206 (absorption maximum wavelength 515 nm) (0.3 g) (e) Pigment blue 15:6 (absorption maximum wavelength 670 nm) (0.15 g) | GBL (50 g) |
| Example 26 | (d) OS 5206 (absorption maximum wavelength 515 nm) (0.3 g) (e) PB 8540 (absorption maximum wavelength 645 nm) (0.6 g) (f) DPHA (12.0 g) | GBL (50 g) |
| Example 27 | (d) OS 5206 (absorption maximum wavelength 515 nm) (0.3 g) (e) PB 8540 (absorption maximum wavelength 645 nm) (0.6 g) (f) DPHA (12.0 g) | GBL (50 g) |
| Comparative example 13 | (d) OS 5206 (absorption maximum wavelength 515 nm) (0.6 g) | GBL (50 g) |
| Comparative example 14 | (e) PB 8540 (absorption maximum wavelength 645 nm) (0.6 g) | GBL (50 g) |
| Comparative example 15 | | GBL (50 g) |
| Comparative example 16 | (d) OS 5206 (absorption maximum wavelength 515 nm) (0.3 g) | GBL (50 g) |
| Comparative example 17 | (d) Pigment red 254 (absorption maximum wavelength 550 nm) (0.15 g) | GBL (50 g) |
| Comparative example 18 | (d) OS 5206 (absorption maximum wavelength 515 nm) (0.3 g) (e) PB 8540 (absorption maximum wavelength 645 nm) (0.6 g) | GBL (50 g) |
| Comparative example 19 | (d) OS 5206 (absorption maximum wavelength 515 nm) (0.3 g) (e) PB 8540 (absorption maximum wavelength 645 nm) (0.6 g) | GBL (50 g) |
| Comparative example 20 | (d) OS 5206 (absorption maximum wavelength 515 nm) (0.3 g) (e) Pigment blue 15:6 (absorption maximum wavelength 670 nm) (0.15 g) | GBL (50 g) |

Abbreviations used in Table are as follows:
PY 8070: Plast Yellow 8070
OS 5206: Oil Scarlet 5206
PB 8540: Plast Blue 8540
GBL: γ-butyrolactone Table 4 shows test results for the sensitivity (ghi-line) (mJ/cm$^2$), postcure transmittance (%), and postcure water absorption rate (%) in Examples 1 to 10 and Comparative examples 1 to 5. Table 5 shows test results for the sensitivity (ghi-line) (mJ/cm$^2$) and postcure transmittance (%) in Examples 11 to 17 and Comparative examples 6 to 12, and Table 6 shows those in Examples 18 to 27 and Comparative examples 13 to 20.

[Amendment 03.08.2016 According to Regulation 91]

TABLE 4

| | Sensitivity (ghi-line) (mJ/cm$^2$) | Light transmittance evaluation after curing | Postcure water absorption rate (%) |
|---|---|---|---|
| Example 1 | 105 | 2 | 1.20% |
| Example 2 | 100 | 2 | 1.00% |
| Example 3 | 95 | 2 | 0.95% |
| Example 4 | 95 | 2 | 0.90% |
| Example 5 | 93 | 2 | 0.86% |
| Example 6 | 100 | 2 | 0.81% |
| Example 7 | 105 | 2 | 0.77% |
| Example 8 | 110 | 2 | 0.72% |
| Example 9 | 125 | 2 | 0.68% |
| Example 10 | 110 | 2 | 1.10% |
| Comparative example 1 | 90 | 1 | 1.35% |
| Comparative example 2 | 130 | 2 | 0.60% |
| Comparative example 3 | 105 | 1 | 0.95% |
| Comparative example 4 | 110 | 1 | 0.95% |
| Comparative example 5 | 400 | 2 | 1.05% |

[Amendment 03.08.2016 According to Regulation 91]

TABLE 5

| | Sensitivity (ghi-line) (mJ/cm$^2$) | Light transmittance evaluation after curing |
|---|---|---|
| Example 11 | 140 | 2 |
| Example 12 | 95 | 2 |
| Example 13 | 115 | 2 |
| Example 14 | 145 | 2 |
| Example 15 | 145 | 2 |
| Example 16 | 150 | 2 |
| Example 17 | 95 | 2 |
| Comparative example 6 | 190 | 2 |
| Comparative example 7 | 130 | 2 |
| Comparative example 8 | 150 | 2 |
| Comparative example 9 | 200 | 2 |
| Comparative example 10 | 200 | 2 |
| Comparative example 11 | 200 | 2 |
| Comparative example 12 | 130 | 2 |

[Amendment 03.08.2016 According to Regulation 91]

TABLE 6

| | Sensitivity (ghi-line) (mJ/cm$^2$) | Light transmittance evaluation after curing |
|---|---|---|
| Example 18 | 100 | 2 |
| Example 19 | 110 | 2 |
| Example 20 | 105 | 2 |
| Example 21 | 115 | 2 |
| Example 22 | 125 | 2 |
| Example 23 | 100 | 3 |
| Example 24 | 120 | 3 |
| Example 25 | 190 | 3 |
| Example 26 | 120 | 3 |
| Example 27 | 110 | 3 |
| Comparative example 13 | 135 | 2 |
| Comparative example 14 | 135 | 2 |
| Comparative example 15 | 140 | 2 |
| Comparative example 16 | 170 | 2 |
| Comparative example 17 | 250 | 2 |
| Comparative example 18 | 140 | 3 |
| Comparative example 19 | 160 | 3 |
| Comparative example 20 | 240 | 3 |

EXPLANATION OF NUMERALS

1: TFT
2: wiring
3: insulation film
4: planarizing film
5: ITO (transparent electrode)
6: substrate
7: contact hole
8: insulation layer

The invention claimed is:

1. A photosensitive colored resin composition comprising:
an alkali-soluble resin (a),
a photosensitive compound (b), and
a compound (c) having an absorption maximum in the wavelength range of 400 nm or more and less than 490 nm,
wherein
the photosensitive compound (b) consists of a photoacid generating agent and a photosensitive compound (b1),
the photosensitive compound (b1) being such that its maximum absorption wavelength in the range of 350 nm or more and 450 nm or less is located within the wavelength range of 350 nm or more and 390 nm or less, and
photosensitive compound (b1) accounts for 5 parts by mass or more and 90 parts by mass or less based on 100 parts by mass, of the photosensitive compound (b).

2. A photosensitive colored resin composition as set forth in claim 1, wherein the photosensitive compound (b1) is a 4-naphthoquinone diazide sulfonyl ester compound.

3. A photosensitive colored resin composition as set forth in claim 1, wherein the alkali-soluble resin (a) is at least one alkali-soluble resin selected from the group consisting polyimides, polyimide precursors, polybenzoxazoles, polybenzoxazole precursors, phenol resins, polymers containing a radical polymerizable monomer having an alkali-soluble group, siloxane polymers, cyclic olefin polymers, and cardo resins, or a copolymer thereof.

4. A photosensitive colored resin composition as set forth in claim 1, wherein the alkali-soluble resin (a) has a structural unit as represented by general formula (1) or general formula (2):

$$\left( \begin{array}{c} \overset{O}{\underset{\|}{C}} \quad \overset{O}{\underset{\|}{C}} \\ N \diagdown R^1 \diagup N - R^2 \\ \underset{\|}{C} \quad \underset{\|}{C} \\ \overset{\|}{O} \underset{(R^3)_p}{} \overset{\|}{O} \end{array} (R^4)_q \right) \tag{1}$$

wherein
$R^1$ is a tetravalent to decavalent organic group,
$R^2$ is being a divalent to octavalent organic group,
$R^3$ and $R^4$ each are a phenolic hydroxyl group, carboxy group, sulfonic group, or thiol group that may be a single group or a combination of different ones thereof, and
p and q each are an integer of 0 to 6,

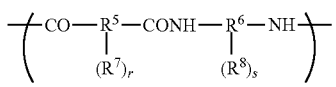

(2)

wherein,

R⁵ is a divalent to octavalent organic group,

R⁶ is a divalent to octavalent organic group,

R⁷ and R⁸ each are a phenolic hydroxyl group, sulfonic group, thiol group, or COOR⁹ that may be present as a single group or a combination of different ones thereof, R⁹ is a hydrogen atom or a monovalent hydrocarbon group containing 1 to 20 carbon atoms, and r and a each are an integer of 0 to 6 and satisfy the following relationship r+s>0.

5. A photosensitive colored resin composition as set forth in claim 4, wherein the photosensitive compound (b1) is a 4-naphthoquinone diazide sulfonyl ester compound.

6. A photosensitive colored resin composition as set forth in claim 5, further comprising a compound (d) having an absorption maximum in the wavelength range 490 nm or more and less than 580 nm and a compound (e) having an absorption maximum in the wavelength range 580 nm or more and less than 800 nm.

7. A photosensitive colored resin composition as set forth in claim 1, further comprising a compound (d) having an absorption maximum in the wavelength range 490 nm or more and less than 580 nm and a compound (e) having an absorption maximum in the wavelength range 580 nm or more and less than 800 nm.

8. A photosensitive colored resin composition as set forth in claim 7, wherein the compound (c) having an absorption maximum in the wavelength range of 400 nm or more and less than 490 nm, the compound (d) having an absorption maximum in the wavelength range 490 nm or more and less than 580 nm, and the compound (e) having an absorption maximum in the wavelength range 580 nm or more and less than 800 nm are dyes.

9. A photosensitive colored resin composition as set forth in claim 7, wherein the compound (c) having an absorption maximum in the wavelength range of 400 nm or more and less than 490 nm is a yellow or orange dye; the compound (d) having an absorption maximum in the wavelength range 490 nm or more and less than 580 nm is a red or violet dye; and the compound (e) having an absorption maximum in the wavelength range 580 nm or more and less than 800 nm is a blue or green dye.

10. A production method for heat resistant colored resin films comprising the following steps:

a coating step for coating a substrate with a photosensitive colored resin composition as set forth in claim 1 to form a coating film, a drying step for drying the coating film to form a dried photosensitive colored resin film, a light exposure step for exposing the dried photosensitive colored resin film to light, a development step for developing the exposed photosensitive colored resin film, and a heat treatment step for heat-treating the developed photosensitive colored resin film.

11. A production method for heat resistant colored resin films as set forth in claim 10, wherein the coating step contains a step for coating a substrate with the photosensitive colored resin composition by a slit nozzle coating method to form a coating film and the drying step contains a step for drying the coating film under reduced pressure to form a photosensitive colored resin film.

12. A production method for heat resistant colored resin films as set forth in claim 10, wherein the light exposure step contains a step for performing exposure to broadband light.

13. A display device comprising a first electrode formed on a substrate, an insulation layer formed to cover the periphery of the first electrode, and a second electrode located so as to face the first electrode, the insulation layer being a cured film produced by curing a photosensitive colored resin composition as set forth in claim 1.

14. A display device as set forth in claim 13 having a resolution of 50 ppi or more.

15. A display device comprising a thin film transistor (TFT) having wiring formed on a substrate, a planarizing film provided so as to cover irregularities on the TFT having wiring, and a display element formed on the planarizing film, the planarizing film being a cured film formed by curing a photosensitive colored resin composition as set forth in claim 1.

* * * * *